United States Patent
Gong et al.

(10) Patent No.: US 12,520,735 B2
(45) Date of Patent: Jan. 6, 2026

(54) ENERGY EFFICIENT FERROELECTRIC DEVICE AND METHOD FOR MAKING THE SAME

(71) Applicants: UNIVERSITY OF MARYLAND, COLLEGE PARK, College Park, MD (US); REGENTS OF THE UNIVERSITY OF MINNESOTA, Minneapolis, MN (US)

(72) Inventors: Cheng Gong, Potomac, MD (US); Tony Low, Woodbury, MN (US); Jian-Ping Wang, Shoreview, MN (US)

(73) Assignees: University of Maryland, College Park, College Park, MD (US); Regents of the University of Minnesota, Minneapolis, MN (US)

( * ) Notice: Subject to any disclaimer, the term of this patent is extended or adjusted under 35 U.S.C. 154(b) by 330 days.

(21) Appl. No.: 18/338,318

(22) Filed: Jun. 20, 2023

(65) Prior Publication Data
US 2023/0413692 A1 Dec. 21, 2023

Related U.S. Application Data

(60) Provisional application No. 63/366,624, filed on Jun. 17, 2022.

(51) Int. Cl.
*H10N 70/20* (2023.01)
*H10N 70/00* (2023.01)

(52) U.S. Cl.
CPC ........... *H10N 70/25* (2023.02); *H10N 70/021* (2023.02); *H10N 70/823* (2023.02); *H10N 70/841* (2023.02); *H10N 70/8822* (2023.02); *H10N 70/8825* (2023.02); *H10N 70/8845* (2023.02)

(58) Field of Classification Search
CPC .... H10N 70/25; H10N 70/021; H10N 70/823; H10N 70/841; H10N 70/8822; H10N 70/8825; H10N 70/8845
See application file for complete search history.

(56) References Cited

PUBLICATIONS

Wang, Qinqin, et al. "Extraordinary tunnel electroresistance in layer-by-layer engineered van der Waals ferroelectric tunnel junctions." Matter 5.12 (2022): 4425-4436.
Wang, Qinqin, et al. "Gate-tunable giant tunneling electroresistance in van der Waals ferroelectric tunneling junctions." Materials Science and Engineering: B 283 (2022): 115829, pp. 1-5.
Wu, Jiangbin, et al. "High tunnelling electroresistance in a ferroelectric van der Waals heterojunction via giant barrier height modulation." Nature Electronics 3.8 (2020): 466-472.

*Primary Examiner* — Samuel A Gebremariam
(74) *Attorney, Agent, or Firm* — Quarles & Brady LLP; Yakov S. Sidorin

(57) ABSTRACT

Disclosed are energy efficient ferroelectric devices and methods for making such devices. For example, a ferroelectric device may be a ferroelectric tunneling junction device that includes a graphene layer on a substrate. A tunneling layer may be disposed on a portion of the graphene layer. The tunneling layer may be a ferroelectric material. A metal electrical contact layer may be disposed over the tunneling layer and the graphene layer. Additionally, some embodiments may have an additional monolayer disposed between the tunneling layer and graphene layer. By specific engineering of such layers, tunneling electroresistance performance may be substantially improved.

21 Claims, 13 Drawing Sheets

FERROELECTRIC TUNNELING JUNCTION DEVICE

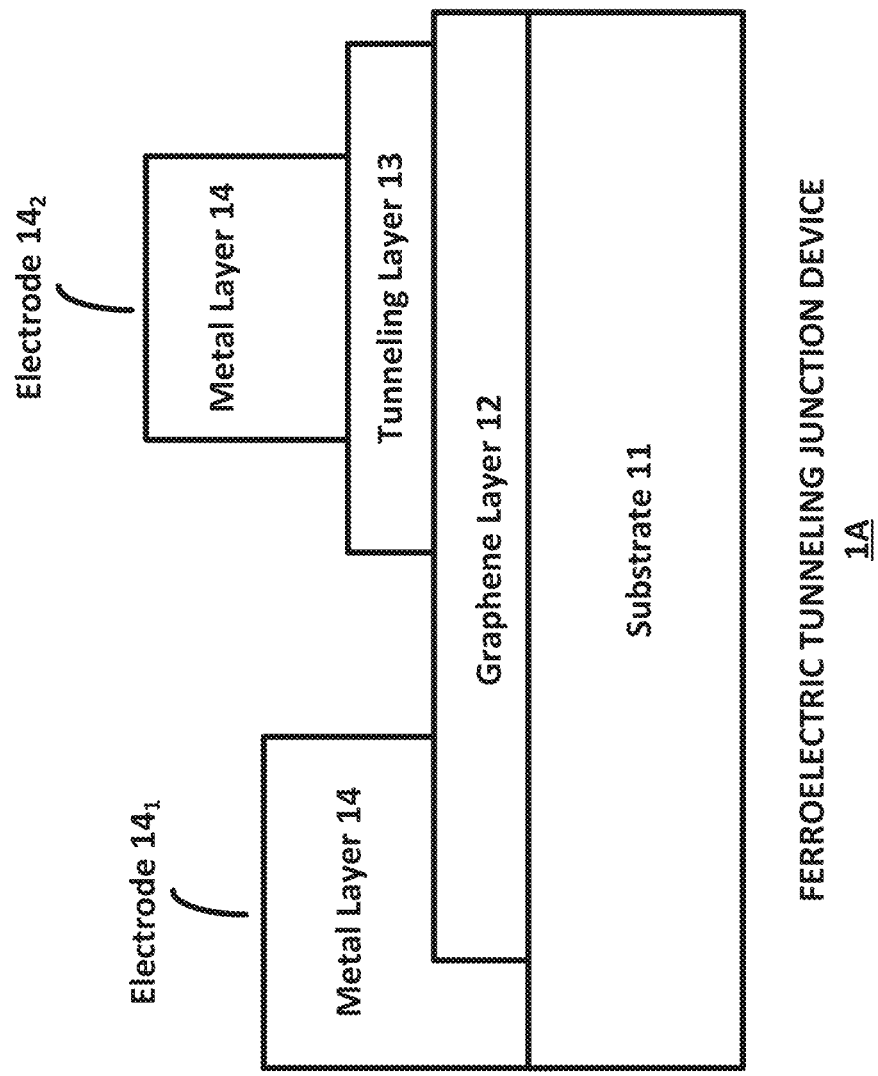

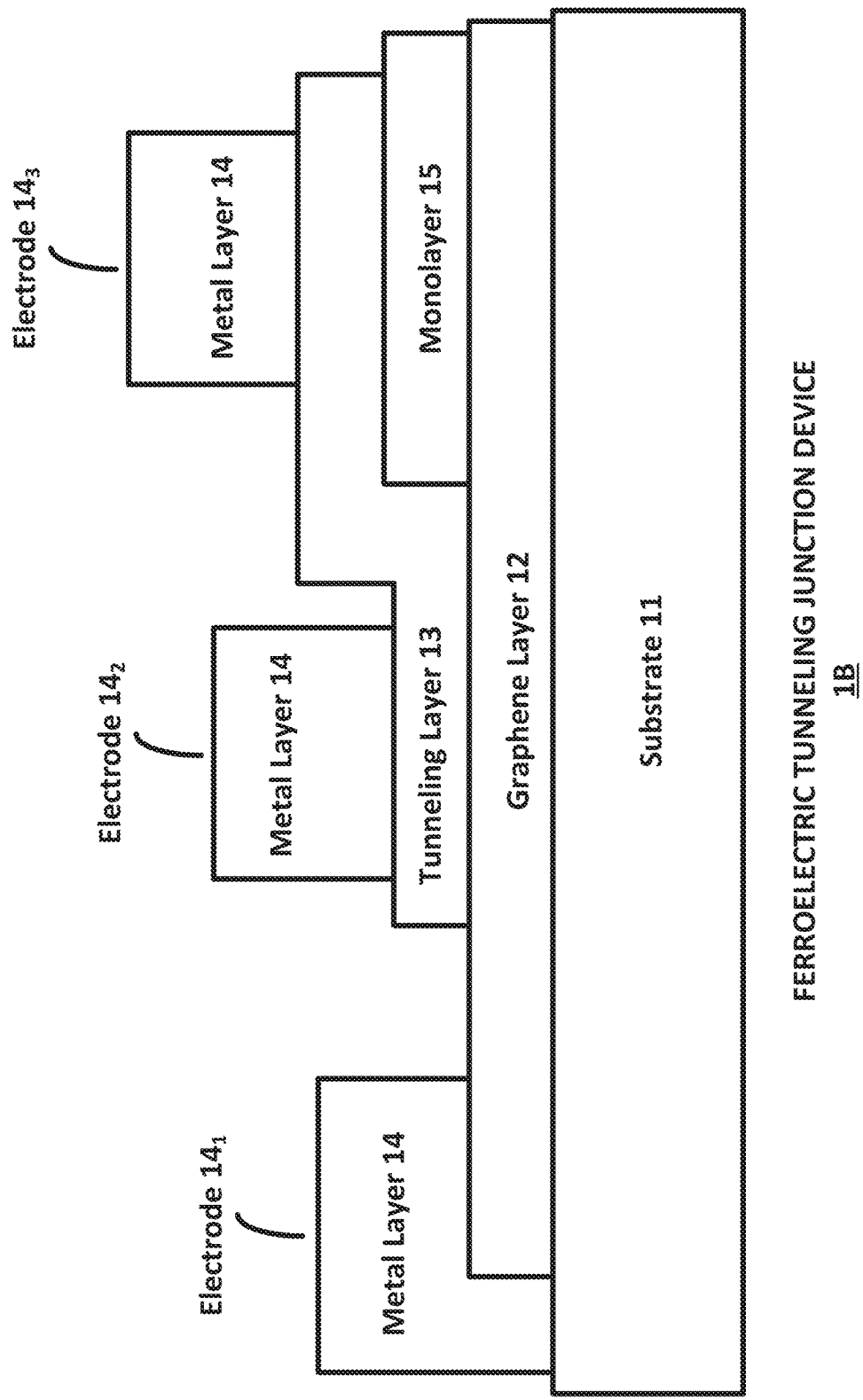

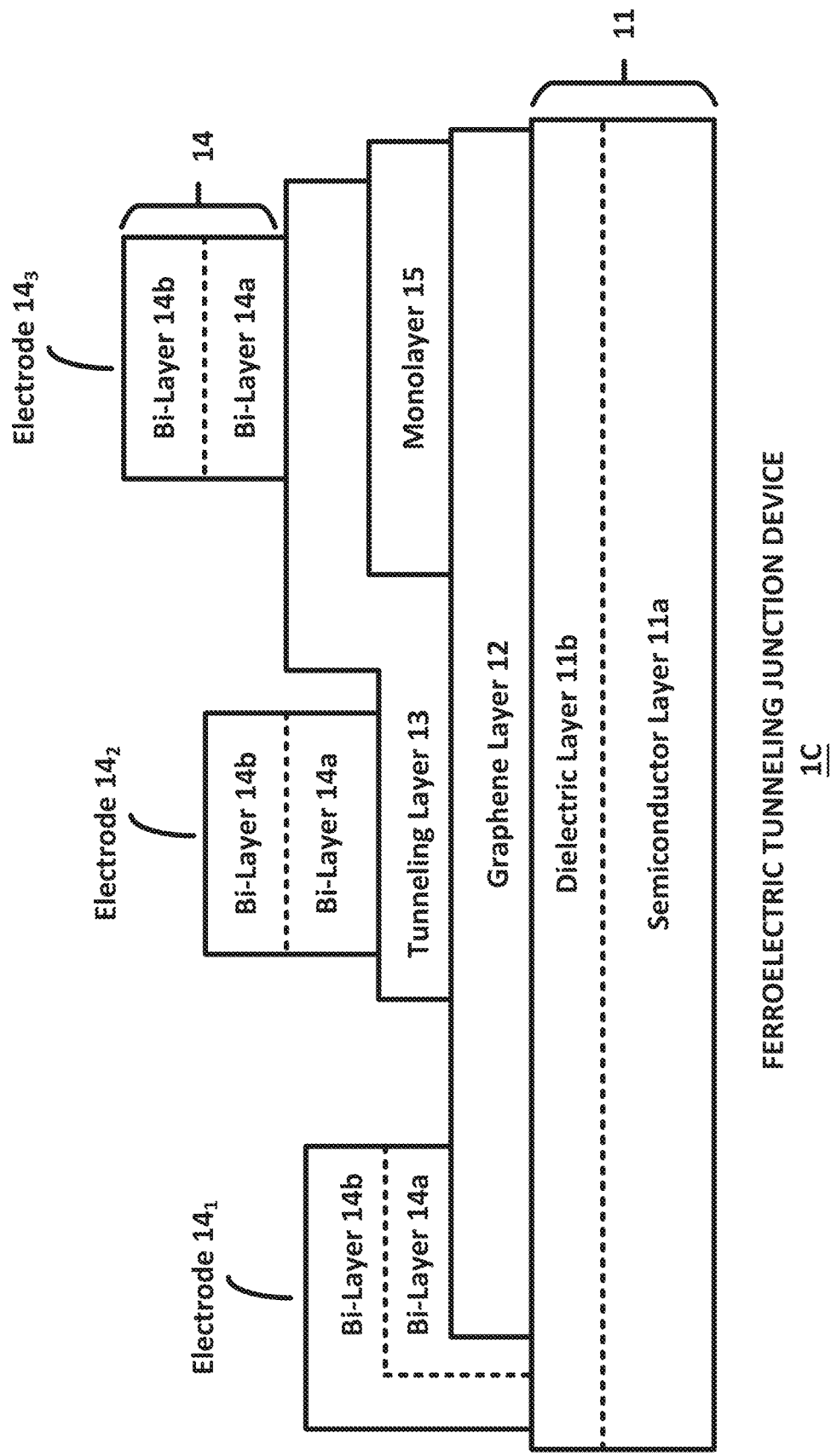

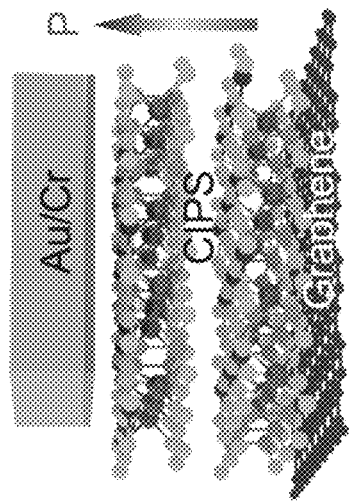
FIG. 7A
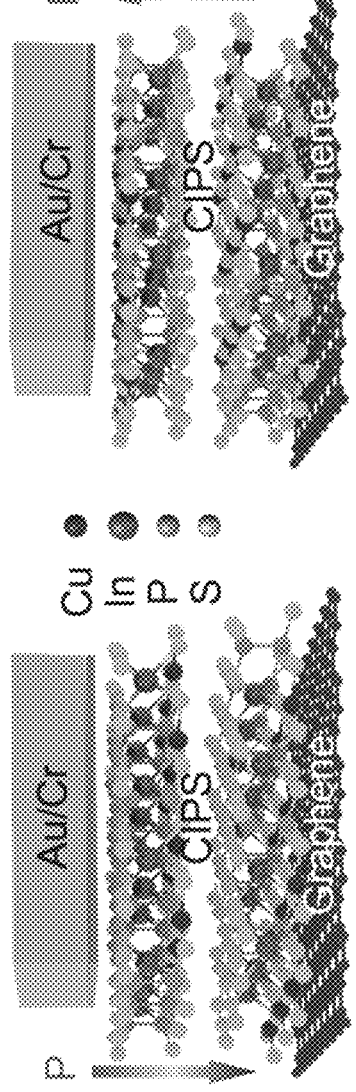
FIG. 7B
FIG. 7C
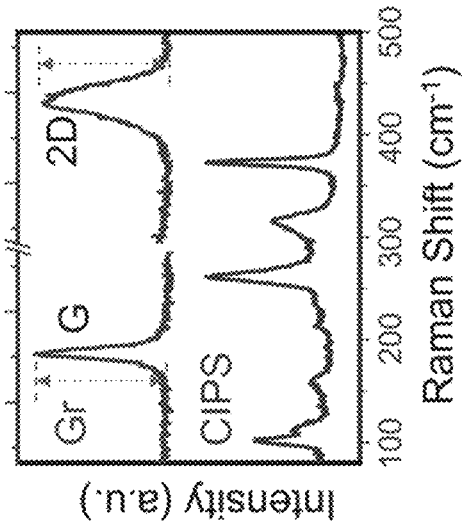
FIG. 7D
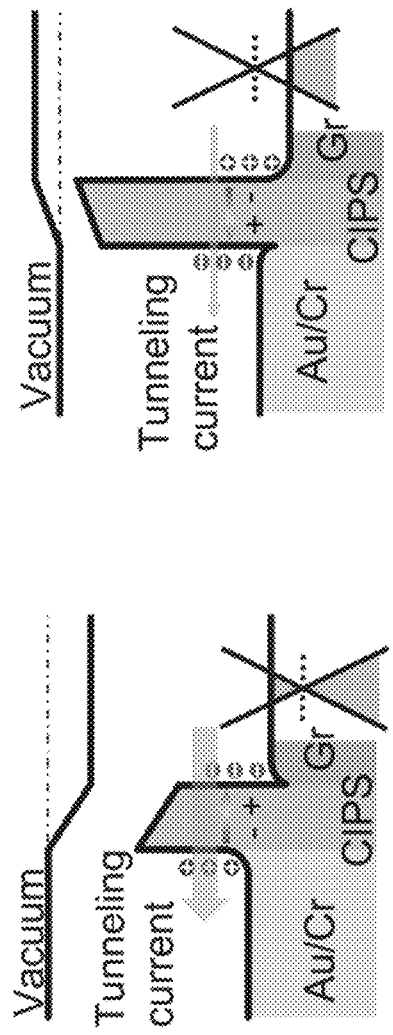
FIG. 7E
FIG. 7F

ENERGY EFFICIENT FERROELECTRIC DEVICE AND METHOD FOR MAKING THE SAME

CROSS-REFERENCE TO RELATED APPLICATIONS

This application claims the benefit of priority to U.S. Provisional Patent Application Ser. No. 63/366,624, filed Jun. 17, 2022, the entirety of which is incorporated herein by reference in full.

BACKGROUND

Ferroelectric tunneling junction (FTJ) devices, a class of two-terminal devices consisting of a thin ferroelectric layer sandwiched between two electrodes, can exhibit large tunneling electroresistance (TER) effect, thereby promising in the next-generation energy-efficient nonvolatile memories. In FTJ devices, a thin ferroelectric layer serves as the electronic quantum tunneling layer and the electrical tunneling conductance can be modulated through the ferroelectric polarization reversal, which is the origin of the tunneling electroresistance. FTJ devices have attracted great interest due to their potential applications in non-volatile memories and neurosynaptic computing.

Traditionally, FTJ devices are mainly constructed based on three-dimensional (3D) ferroelectric materials, particularly the perovskite structure (ABO3) family has been most extensively studied. However, the depolarization field in conventional 3D ferroelectric materials impose a critical thickness, where the ferroelectric would fail if being scaled thinner, preventing the downscaling of switching voltages FTJ devices for low power operation. Also, the unavoidable interfacial states in conventional 3D materials stacks compromises the tunneling electroresistance, setting roadblocks for the realization of very high tunneling electroresistance (typically for a perovskite oxide FTJ, the maximum tunneling electroresistance was reported to be about $10^6$).

Recently, the emergent two-dimensional (2D) ferroelectric materials without surface dangling bonds show promise in breaking through the limitations of critical thickness in conventional 3D FTJ devices, enabling ultra-thin non-volatile memories and neurosynaptic computing micro-nano devices. To date, FTJ devices based on 2D ferroelectric materials (e.g., $CuInP_2S_6$ (CIPS), SnSe, etc.) have been demonstrated. Some of them exhibit high tunneling electroresistance ratios up to $10^7$, even remaining above $10^6$ after 5,000 cycles of writing/reading operations, showcasing the great potential for high endurance memory and computing applications. Though many efforts have been devoted to this direction, challenges remain regarding device tunability and further enhancement of giant tunneling electroresistance.

SUMMARY

The present disclosure provides systems and methods for implementing efficient ferroelectric tunneling junction devices, including various layers, thicknesses, materials, and configurations of the same for providing improved TER.

In one embodiment, a ferroelectric device may comprise a substrate; a first two dimensional (2D) ferroelectric layer disposed on the substrate, the first 2D layer comprising a first 2D ferroelectric material and being 2 to 4 monolayers in thickness; a second 2D ferroelectric layer selectively disposed over a portion of the first 2D layer, the second 2D layer comprising a second 2D ferroelectric material and being at least two monolayers; and a first metallic electrical contact layer disposed on the first 2D ferroelectric layer and a second metallic electrical contact layer disposed on the second 2D layer such that the second 2D ferroelectric layer is between the second metallic electrical contact layer and the graphene layer.

In related embodiments, the first and second 2D layers may have other thicknesses.

Relatedly, a ferroelectric device may be provided wherein the first 2D ferroelectric material is graphene.

In other embodiments, the ferroelectric device may have the second 2D ferroelectric layer comprising a tunneling layer. And, a monolayer may be provided between the first 2D layer and the tunneling layer. Further, the ferroelectric device may be provided, wherein the tunneling layer is between a metal layer and the monolayer. In some implementations, the ferroelectric device may be provided, wherein the monolayer is in direct contact with the graphene layer and the tunneling layer. In some embodiments, the ferroelectric device may be provided, wherein the monolayer is a transition metal dichalcogenide. In some embodiments, the ferroelectric device may be provided, wherein the monolayer is molybdenum disulfide ($MoS_2$). And, in some embodiments, the ferroelectric device may be provided, wherein the monolayer is tungsten diselenide ($WSe_2$).

In some embodiments, a ferroelectric device may be provided, wherein the first 2D ferroelectric layer is a graphene layer having a thickness of a single carbon atom.

In other embodiments, the ferroelectric device may be provided, wherein a tunneling electroresistance (TER) of the ferroelectric device is greater than approximately 1010.

In other embodiments, the ferroelectric device may be provided, wherein the second 2D ferroelectric material has a perovskite structure.

In other embodiments, the ferroelectric device may be provided, wherein the second 2D ferroelectric material is $CuInP_2S_6$ (CIPS).

In yet further embodiments, the ferroelectric device may be provided, wherein the second 2D ferroelectric material is SnSe.

In additional embodiments, the ferroelectric device may be provided, wherein the substrate has a thickness of approximately 260-nm.

In other embodiments, the ferroelectric device may be provided, wherein the substrate comprises a semiconductor layer and a dielectric layer, the dielectric layer is between the first 2D ferroelectric layer and the semiconductor layer. Optionally, such a ferroelectric device may have a semiconductor layer doped with a dopant. In some embodiments, the dopant is a P-type dopant.

In other embodiments, the ferroelectric device may be provided, wherein the second metallic electrical contact layer comprises a lower metal layer and an upper metal layer, the upper metal layer being thicker that the lower metal layer. Optionally, the upper metal layer and lower metal layer are different materials, and a portion of the lower metal layer is in direct contact with the tunneling layer.

In another aspect, a device is provided, comprising: a top layer which may be metal or metallic; a tunnelling layer, which may comprise 2D materials including CIPS or In2Se3; a bottom layer, which may comprise 2D electron material including graphene and/or transition metal dichalcogenides (TMDs); and a monolayer disposed between the tunnelling layer and the bottom layer, which may comprise MoS2, WSE2 or oxide materials. In some embodiments, the monolayer may be optional.

In further aspects, methods are provided for manufacturing devices such as described above. In one example, such a method may include depositing a first 2D ferroelectric layer on a substrate; depositing a second 2D ferroelectric layer above a portion of the first 2D ferroelectric layer; depositing a conductive layer over at least a portion of the second 2D ferroelectric layer and at least a portion of the first 2D ferroelectric layer. In some embodiments, the first 2D ferroelectric layer may comprise graphene, and optionally a predetermined number of monolayers of graphene. In some embodiments the layers may be 2-4. In further embodiments, the second 2D ferroelectric layer may comprise CIPS, optionally a predetermined number of monolayers of CIPS. In some embodiments there may be at least two monolayers. In further embodiments, a third layer may be selectively deposited between the first and second 2D ferroelectric layers (e.g., covering only a portion of the first 2D ferroelectric layer, and existing beneath some or all of the second 2D ferroelectric layer). The third layer may comprise MoS2, WSE2 or other materials as described herein. In some embodiments, portions of the first 2D ferroelectric layer may be selectively removed from the substrate before subsequent layers are deposited.

BRIEF DESCRIPTION OF THE FIGURES

The accompanying drawings, which are incorporated in and form a part of this specification, illustrate examples of the disclosure and, together with the description, explain principles of the examples.

The invention will provide details in the following description of preferred embodiments with reference to the following Figures wherein:

FIG. 1A is a cross-sectional view of a ferroelectric tunneling junction device.

FIG. 1B is a cross-sectional view of a ferroelectric tunneling junction device.

FIG. 1C is a cross-sectional view of a ferroelectric tunneling junction device.

FIG. 7A and FIG. 7B illustrate device structure and states according to an embodiment.

FIG. 7C is an optical image of a heterostructure according to an embodiment hereof.

FIG. 7D and FIG. 7E are band diagrams for on and off states of a ferroelectric tunneling junction device.

FIG. 7F is a graph of Raman shift for an embodiment of the present disclosure.

Figure 1D:
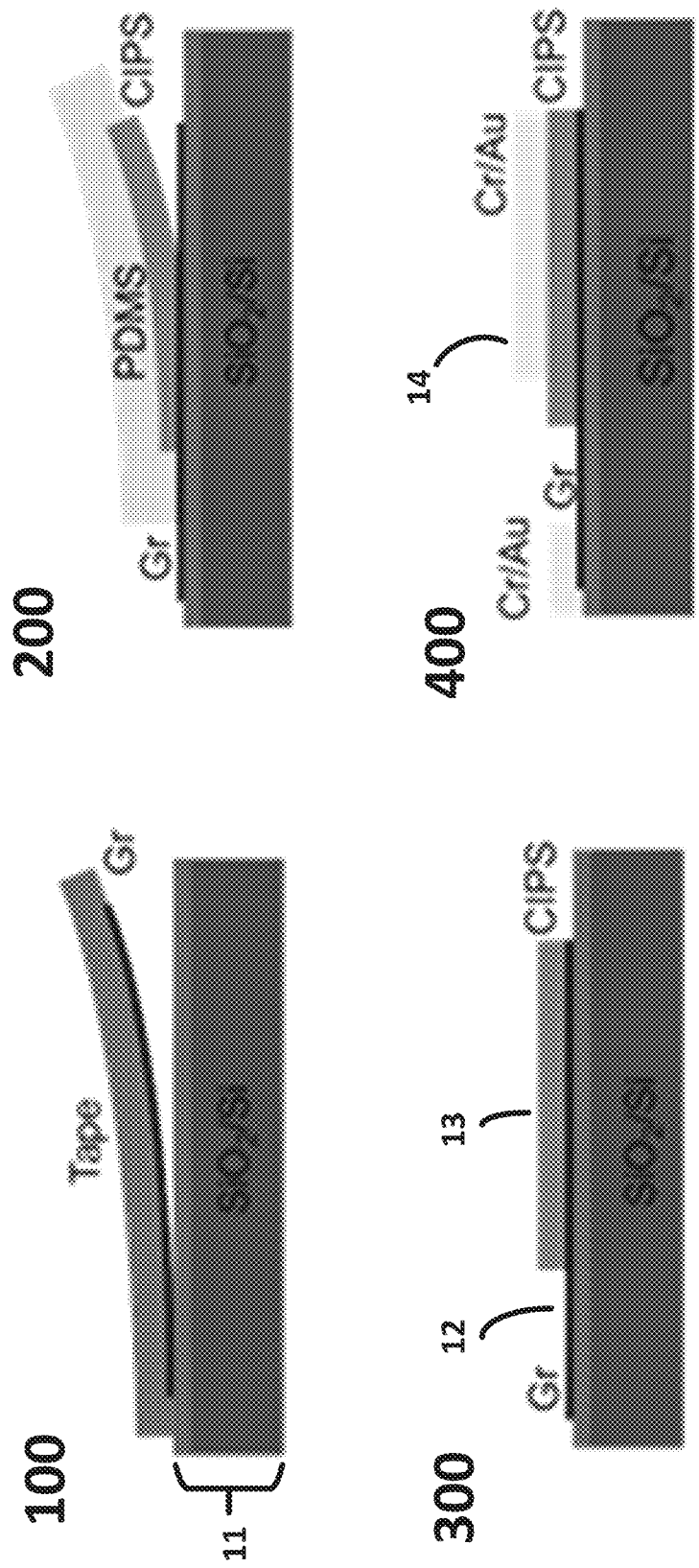
FIG. 1D is a schematic illustration of an example of one of several fabrication processes of a ferroelectric tunneling junction device.

These and other features and advantages will become apparent from the following detailed description of illustrative embodiments thereof, which is to be read in connection with the accompanying drawings.

Additional advantages of the invention will be set forth in part in the description which follows, and in part will be obvious from the description, or can be learned by practice of the invention.

DETAILED DESCRIPTION

The present invention can be understood more readily by reference to the following detailed description of the invention and the examples included therein.

Embodiments of the disclosure are described in detail below with reference to the accompanying figures. Unless otherwise indicated, like parts and method steps are referred to with like reference numerals.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Throughout the application, use of ordinal numbers (e.g., first, second, third, etc.) is not intended to imply or create any particular ordering for any of the elements. Nor does the use of ordinal numbers limit any element to being only a single element, unless expressly disclosed.

Aspects of the present disclosure are best understood from the following detailed description when read with the accompanying Figures. It is noted that the dimensions of the various features within the accompanying Figures are not drawn to scale unless otherwise stated herein.

Unless explicitly stated otherwise, each element having the same reference numeral is presumed to have the same material composition and to have a thickness within a same thickness range.

Before the present compounds, compositions, articles, systems, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

Disclosed herein is a ferroelectric tunneling junction (FTJ) device that is based on the mechanically exfoliated 2D ferroelectric material CIPS on the standard $SiO_2$/Si substrate, and more than seven orders of TER ratio between low- and high-resistance states are realized. Furthermore, what is demonstrated is that the on-state tunneling current can be effectively tuned by simply applying gate voltages and the magnitude of the current increased monotonically as the voltage increased. Specifically, when applying a 50 V gate voltage, the on-state tunneling current can be doubled. The realization of giant TER with gate-tunable ON state current may open practical avenues for additional functionality and configurability in next-generation non-volatile memories and analog electronics.

FIG. 1A is a cross-sectional view of ferroelectric tunneling junction device 1A. FIG. 1B is a cross-sectional view of ferroelectric tunneling junction device 1B. FIG. 1C is a cross-sectional view of the FTJ device 1B in FIG. 1B. Details pertaining to the structural parts in FIG. 1B that are identified by the reference numerals in FIG. 1B are equally applicable to the similarly numbered structural parts in FIG. 1A. Ferroelectric tunneling junction devices 1A and 1B are collectively described herein as ferroelectric tunneling junction (FTJ) device 1.

The FTJ device 1 includes a substrate 11. Also in FIGS. 1A 1B, a graphene layer 12 is on the substrate 11. A tunneling layer 13 is on the graphene layer 12 in FIGS. 1A and 1B. A patterned metal layer 14 is shown in FIGS. 1A and 1B.

FIG. 1C is a cross-sectional view of the FTJ device 1 of FIG. 1B. Illustrated in FIG. 1C, the substrate 11 may include a semiconductor layer 11a. The semiconductor layer 11a may be a silicon (Si) layer. When semiconductor layer 11a is an Si layer, the semiconductor layer 11a may be crystalline, polycrystalline, or amorphous. The semiconductor layer 11a may be doped with a dopant. The semiconductor layer 11a may be P-type, N-type, or a combination of N-type and P-type. The semiconductor layer 11a may be a back gate for the ferroelectric tunneling junction device. The substrate 11 may comprise a III-V compound semiconductor. The substrate 11 may comprise a resin layer. The substrate 11 may comprise a glass layer. In FIG. 1C, the substrate 11 may include a dielectric layer 11b with the dielectric layer 11b being on the semiconductor layer 11a. The dielectric layer 11b may be an oxide. The dielectric layer 11b may be $SiO_2$. The dielectric layer 11b may be a nitride. The dielectric layer 11b may comprise an oxide and a nitride. The dielectric layer 11b may be a resin. The dielectric layer 11b may be material that is sufficient to form a gate insulating film of a field effect transistor. The thickness of the substrate 11 is 260-nm.

Also in FIGS. 1A, 1B and 1C, a graphene layer 12 is on the substrate 11. The graphene layer 12 may be a single-atom thick layer. The structure of the graphene in the graphene layer 12 may be a two-dimensional closely packed honeycomb carbon lattice. In other embodiments, for layer 12, $MoS_2$, $WSe_2$, $WTe_2$, or black phosphorene may replace or be used in combination with graphene.

A tunneling layer 13 is on the graphene layer 12 in FIGS. 1A, 1B and 1C. The tunneling layer 13 may be a ferroelectric material. The ferroelectric material may have a perovskite structure. The ferroelectric material may be a 2D ferroelectric material (e.g., $CuInP_2S_6$ (CIPS), $In_2Se_3$, SnSe, etc.). In some embodiments, the 2D CIPS (or similar material) may be deposited in as one monolayer, two monolayers, three monolayers, four monolayers, or the like. For example, in one embodiment, two monolayers of CIPS are deposited, such that the thickness of the CIPS layer is essentially two times the molecular height of CIPS.

A metal layer 14 is shown in FIGS. 1A, 1B and 1C. As illustrated in FIG. 1C, the metal layer 14 may comprise a bi-layer 14a and a bi-layer 14b. The bi-layer 14b may be in direct contact with the bi-layer 14a. The bi-layer 14a is a metal. The bi-layer 14b is another metal that differs from the bi-layer 14a. The bi-layer 14a may be in direct contact with the graphene layer 12. The bi-layer 14a may be in direct contact with the tunneling layer 13. The bi-layer 14a may be chromium (Cr). The thickness of the bi-layer 14a may be about 5 nm. The bi-layer 14b may be gold (Au). The thickness of the bi-layer 14b may be about 50 nm. The thickness of the bi-layer 14b may about ten times the thickness of the bi-layer 14a. The metal layer 14 in FIGS. 1A, 1B and 1C is patterned into electrodes. Electrode $14_1$ and electrode $14_2$ are present in FIGS. 1A and 1B. An additional electrode $14_3$ is present in FIG. 1C.

In FIGS. 1B and 1C, a monolayer 15 is between the graphene layer 12 and the tunneling layer 13. The monolayer 15 may be a transition metal dichalcogenide (TMD). The TMD may be molybdenum disulfide ($MoS_2$). The TMD may be tungsten diselenide ($WSe_2$).

As shown in FIG. 1D, the FTJ 1 is fabricated through a layer-by-layer process. Though, as described below, other processes are possible and specifically contemplated herein. First, nanometer-thick graphene flakes (i.e., one to a few atomic layers thick) were mechanically exfoliated directly onto a 260-nm-thick $SiO_2$/Si substrate. The ultrathin graphene flakes can be easily identified by their optical contrast under optical microscope. However, it is to be understood that in other embodiments, a single layer, double layer, or 3-4 layer graphene can be deposited via known processes over a substrate, such as by chemical vapor deposition techniques. For example, a graphene layer 12 may be grown by a CVD process (chemical vapor deposition) or an ALD process (atomic layer deposition). Other materials that may replace graphene include black phosphorene, metallic $WTe_2$, doped $MoS_2$ or $WSe_2$, etc.

Thereafter, for the fabrication of the tunneling layer 13, FIG. 1D shows that a thin CIPS film was exfoliated on polydimethylsiloxane (PDMS) and transferred onto the graphene flake using the all-dry viscoelastic stamping procedure under an optical microscope. The CIPS layer in the drawing figures may be grown by MBE (molecular beam epitaxy). Alternatively, $In_2Se_3$ may replace CIPS and deposited onto the substrate 11 by a CVD process. The drawing figures may depict two CIPS layers for illustrative purposes only. In some embodiments, the 2D CIPS (or similar material) may be deposited as one monolayer, two monolayers, three monolayers, four monolayers, or the like. For example, it has been found that the CIPS layer having four layers is easy to handle by mechanical exfoliation due to its thickness and may also generate great results in terms of TER performance.

The bi-layer metallic electrodes (Cr/Au, 5/50 nm) may be patterned using standard electron-beam lithography (EBL) and deposited by thermal evaporation. In the whole flake exfoliation and transfer process, the presence of bubbles in between vdW layers was not noticed, indicating a good interfacial contact. Though annealing after the device fabrication may be unnecessary, the unintentional heating associated with the thermal evaporation process can gently anneal the sample to strengthen the interfacial contact and release the unintentional strain. These are potential reasons for the excellent device performance (to be discussed later), even without subjecting the device to any post annealing treatments, a procedure that is commonly used in the field.

FIG. 1D is a schematic illustration of one example of a fabrication process of FTJs. At step 100 of FIG. 1D, ultrathin graphene flakes are mechanically exfoliated on 260-nm-thick-$SiO_2$/Si chips, followed by the mechanical exfoliation in step 200 of FIG. 1D of ultrathin CIPS flakes by polydimethylsiloxane (PDMS) and being transferred in step 300 of FIG. 1D onto the ultrathin graphene flakes under optical microscope. Last, two 5-nm-Cr/50-nm-Au electrodes are defined in step 400 of FIG. 1D by e-beam lithography and deposited by thermal evaporation onto graphene and CIPS separately. When a small voltage is applied between these two electrodes, the electron tunnelling can be expected through the ultrathin CIPS layer.

Unexpectedly Good Results

The following is evidence of results that are unexpectedly good.

(a) First Example of Unexpectedly Good Results

FIG. 2 shows a representative optical image of a fabricated tunneling device, and the area of the tunneling junction is about 40 $\mu m^2$. For this two-terminal device, the reading and writing will be through the same pair of electrodes. As will be discussed later, a pulse voltage will be applied to write the ferroelectric polarization. The voltage and measure the tunneling current may be subsequently swept after the writing operation.

Figure 2B:
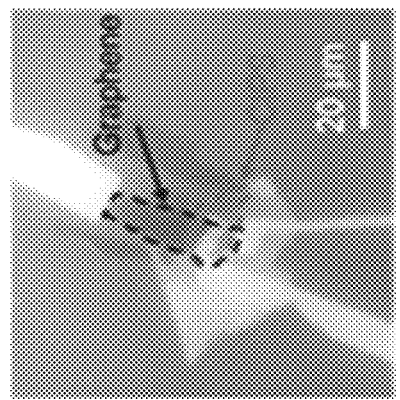
FIG. 2B shows an optical image of a fabricated ferroelectric tunneling junction.
Figure 2A:
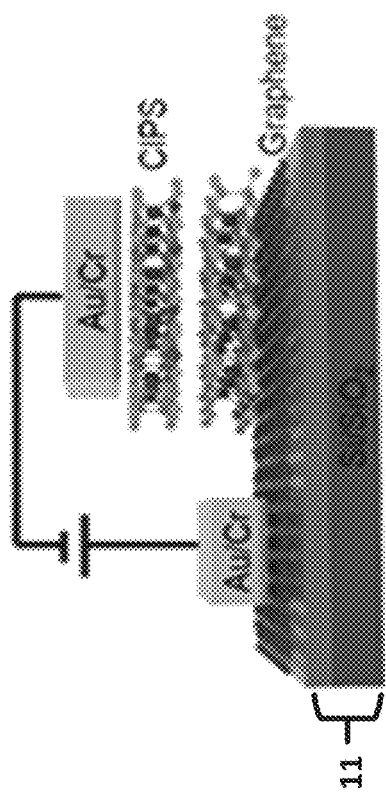
FIG. 2A shows a representative structure of a device in accordance with an embodiment of the present disclosure.

FIG. 2A shows a schematic of a FTJ structure, consisting of a thin CIPS flake as the ferroelectrics and thin graphene and Cr/Au as two electrodes. FIG. 2B is an optical image of the fabricated device. The regions surrounded by the dashed lines represent the top CIPS 13 and the underneath few-layer graphene, respectively. The scale bar in FIG. 2B is 20 $\mu m$.

FIG. 2A shows a schematic of the vdW FTJ device structure, where a thin CIPS flake serves as the tunneling layer, and the bottom and top electrodes are graphene and Cr, respectively. FIG. 2B shows a representative optical image of the fabricated tunneling device, and the area of the tunneling junction is about 40 $\mu m^2$. For this two-terminal device, the reading and writing will be through the same pair of electrodes. As will be discussed later, a pulse voltage will be applied to write the ferroelectric polarization. After the writing operation, the voltage can be subsequently swept and the tunneling current can be measured.

Figure 3:
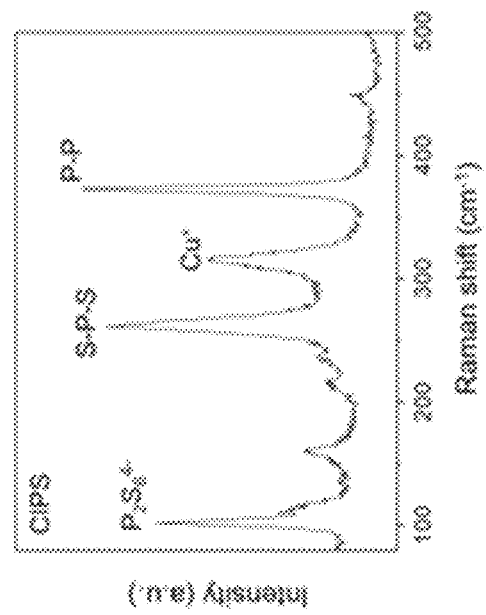
FIG. 3 illustrates a Raman spectrum of a CIPS thin film at room temperature.
Figure 4A:
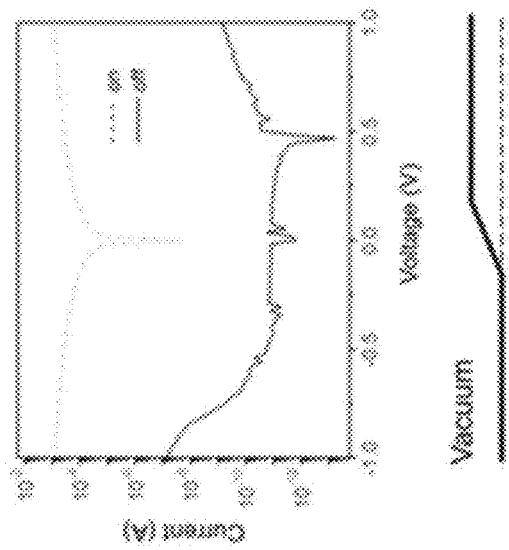
FIG. 4A and FIG. 4B illustrate current-voltage characteristics for states of an embodiment.
Figure 4B:
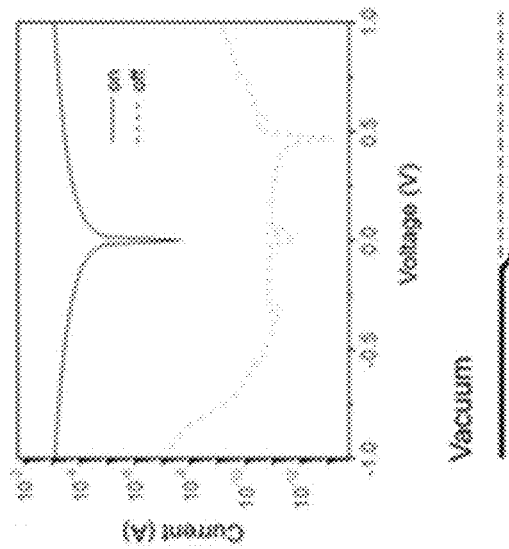
Figure 4C:
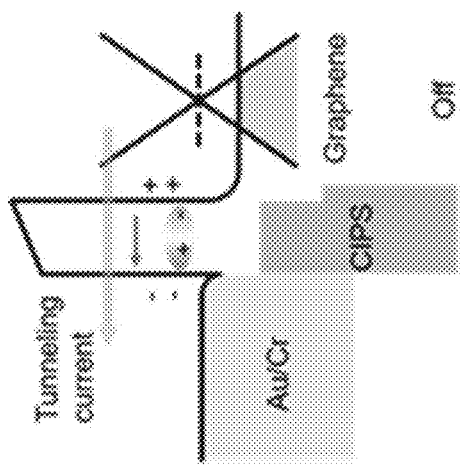
FIG. 4C and FIG. 4D show state diagrams of a ferroelectric tunneling junction.
Figure 4D:
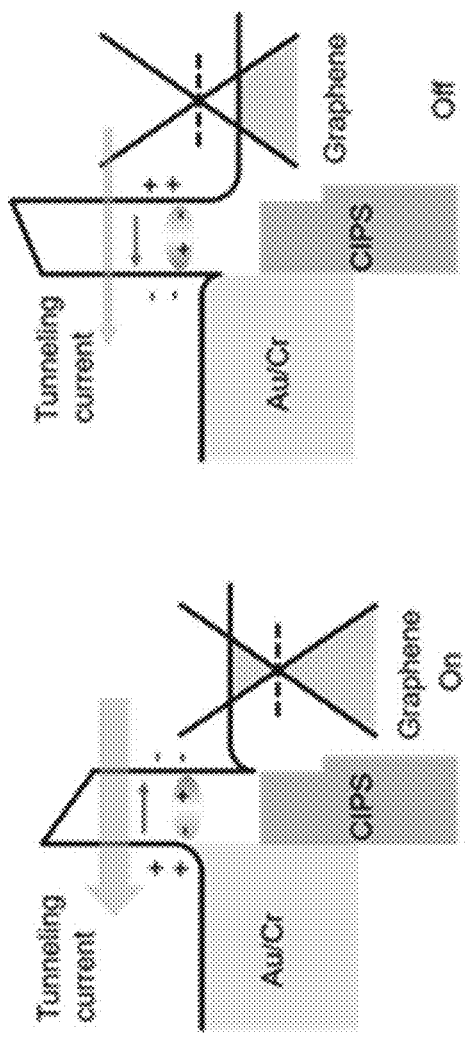

FIG. 3 illustrates a Raman spectrum of CIPS thin film 13 at room temperature. The series of sharp Raman peaks are consistent with the previous experimental report of high quality CIPS crystals, showcasing the excellent crystalline quality of the mechanically exfoliated CIPS flake. The crystal quality of the ferroelectric spacing layer will be critical for the large TER and sizable endurance.

FIG. 3 presents the Raman spectrum of an exfoliated CIPS thin film 13 at room temperature with an excitation laser wavelength of 532 nm. The laser was focused on the samples via a 50× objective with a numerical aperture of 0.5. One bandpass filter was used to clean up laser spectral noise, and three Bragg notch filters were used to suppress the Rayleigh line bandwidth down to ~8 $cm^{-1}$. The peak at around 100 $cm^{-1}$ arises from the vibrations of anion ($P_2S_6^{4-}$), and the peak at 262 $cm^{-1}$ is related to S—P—S vibrations. $Cu^+$ ions are responsible for the peak located at 316 $cm^{-1}$, and the peak at 373 $cm^{-1}$ is caused by P-P stretching. These well-defined Raman features agree well with the previous experimental reports based on high quality as synthesized bulk crystal of CIPS, indicating the crystalline quality of the exfoliated CIPS flake. The high crystallinity with minimum density of defects will be critical for the high TER, sizable endurance and high threshold of voltages may be applied before dielectric breaks down or leakage current surges.

Of FIG. 4, a pulse writing voltage with a period of 200 ms to flip the ferroelectric polarization of the tunneling devices was used. After the writing operation and the withdrawal of the write voltage, the tunneling current was recorded under a reading voltage of −0.4 V, or under a series of sweeping voltages, depending on specific measurement modes. To avoid the ferroelectric-paraelectric phase transition unintentionally caused by the Joule heating effect arising from the tunneling current, a low duty cycle (0.5%) was used to keep the device temperature being lower than the ferroelectric Curie temperature (Tc) of CIPS (~315 K). Before applying the writing voltages, it was observed that the initial states of FTJ tend to be in off-state with an extremely low tunneling current (~$10^{-11}$ A) under −0.4 V reading voltage. To avoid breaking the device, this process was started from a relatively low pulse voltage (2 V) to try to flip the CIPS polarization, and the device remained in the off-state until the pulse voltage reached 3.4 V. After applying a pulse voltage of 3.4 V, the device switched to the on-state with a relatively high tunneling current (~$10^{-4}$ A) under the same reading voltage (FIG. 4A). By applying an opposite pulse voltage (−3.6 V), the FTJ device switched back to the off-state as shown in FIG. 4B, which demonstrates a high TER ratio up to seven orders of magnitude.

FIG. 4 illustrates a current-voltage characteristics and band diagrams of the FTJ. FIG. 4A illustrates a current-voltage characteristic of on-state. FIG. 4B illustrates a current-voltage characteristic of off-state. FIG. 4C illustrates band diagrams for the on-state of the FTJ. FIG. 4D illustrates band diagrams for the off-state of the FTJ. The built-in polarization field in the CIPS 13 is shown with arrows, and the tunneling current is indicated by the arrows.

The giant modulation of the on/off state tunneling current arises from the following: (1) the Fermi level of graphene can be effectively modulated by the CIPS layer 13 of opposite polarizations, and (2) the tunnel barrier itself (heights and width) strongly depends on the built-in polarization electric field within the CIPS tunneling barrier layer 13. Since the cold electron transmission probability depends exponentially on the barrier height, the difference between the Fermi level of graphene and the conduction band minimum of the CIPS barrier layer affects the tunneling current significantly.

With a positive writing voltage (3.4 V), the positive charge center ($Cu^+$) moves close to the graphene side and increases the electron concentration in graphene, causing the Fermi level of graphene to shift from relatively intrinsic to well above the Dirac point (n-doped). Therefore, the probability of electrons tunneling through the CIPS 13 increases with the reduced height of the tunneling barrier, resulting in a larger tunneling current (on-state). Conversely, negative writing voltage (−3.6 V) flips the polarization electric field in the opposite direction, which could reduce the electron concentration in graphene and shift the Fermi level below the Dirac point (p-doped). Correspondingly, the higher tunneling barrier between CIPS 12 and graphene 12 causes a remarkable decrease in the tunneling current (off-state).

Furthermore, when continuously switching the positive and negative writing voltages, the on/off state of the FTJ device could be reliably and repeatedly controlled. In these operations, the TER could be maintained at $10^6$, as shown of FIG. 5. The off-state current that was measured is on the order of $10^{-11}$ A, which is the equipment's measurable resolution of the Agilent 4155C semiconductor parameter analyzer. Per the data of the similar device reported in previous literature, the off-state current could potentially on the order of $10^{-13}$ A or even lower. Considering the instrumental resolution in small current measurement, it was reasonably expected that the true TER could be two orders of magnitude higher than the herein reported $10^7$.

Figure 5:
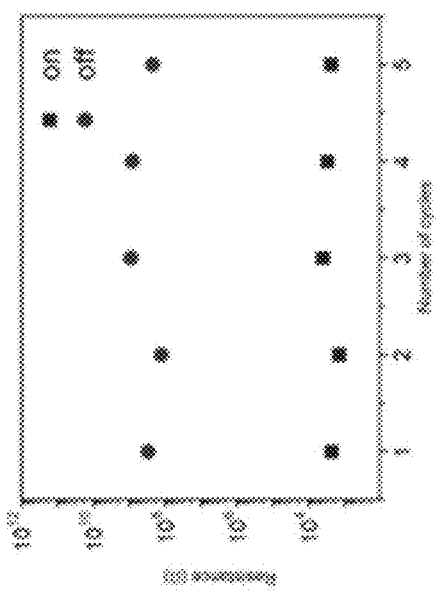
FIG. 5 illustrates repetitive characterizations of a ferroelectric tunneling junction device.

FIG. 5 illustrates repetitive characterizations of the FTJ device. The writing and reading operations were repeated multiple times, and the clear contrast between ON and OFF states is highly reproducible.

Figure 6B:
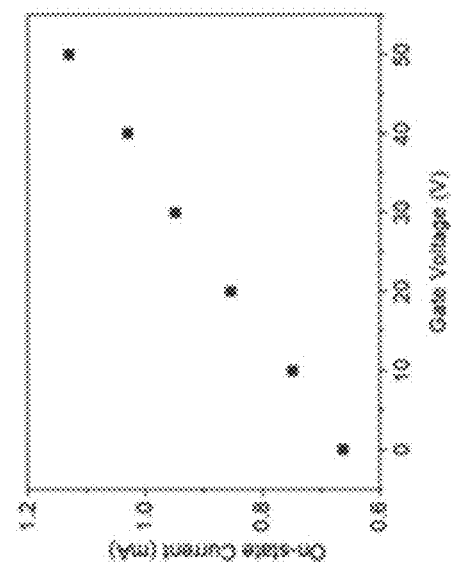
FIG. 6B depicts a graph of on-state current versus gap voltage.
Figure 6A:
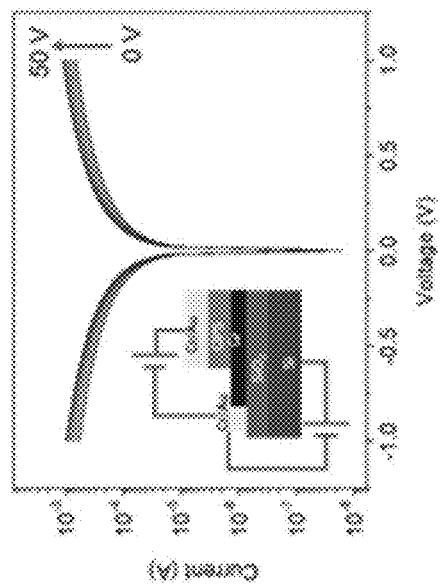
FIG. 6A depicts current-voltage characteristics of an example ferroelectric tunneling junction device.

FIG. 6A illustrates on-state current-voltage characteristics for FTJ under different gate voltages applied on graphene. FIG. 6A is the schematic of the device structure. 260-nm-thick $SiO_2$ served as the dielectric layer and the bottom Si (p++) served as the back-gate electrode. FIG. 6B illustrates on-state currents (with 1 V reading voltage) under different gate voltages. The magnitude of the tunneling current increases monotonically as the gate voltage increases.

Given the general tunability of 2D materials, it is possible to tune the tunneling current in FTJ devices using these materials, which could be useful for many device applications such as analog electronics and neurosynaptic computing. Specifically, as illustrated in the device architecture of FIG. 2, 260-nm-thick $SiO_2$ was used as the dielectric layer and the bottom Si (p++) served as the back-gate electrode. FIG. 6A depicts the on-state current-voltage characteristics of the FTJ with different gate voltages. The on-state current increased with the increasing gate voltages at all the reading voltages (from −1 V to 1 V). FIG. 6B summarizes the on-state currents with a set 1 V reading voltage for different gate voltages. Without applying a gate voltage, the pristine on-state current is ~0.5 mA at 1 V, which linearly increases with the increasing gate voltages. When the gate voltage increased to 50 V, the on-state current can achieve ~1 mA, which is two folds of the pristine on-state current. The increased tunneling current is explained by the gate voltage raising the Fermi energy in graphene, leading to a decreased tunneling barrier height. The gate-tunable on-state current opens new avenues to creating multiple intermediate states within the already large on/off window ($10^7$). Thus, engineering multiple states within the large on/off window may provide viable routes toward analogue electronics, neuromophic computing, and computing in memory.

In this disclosure, various embodiments of vdW heterostructure FTJ devices can be constructed based on 2D ferroelectric CIPS and 2D semimetal graphene, and the devices will exhibit a high TER ratio up to approximately $10^7$. This high TER ratio arises from the effective ferroelectric modulation of the chemical potentials in graphene and the tunneling barrier height. Remarkably, the tunneling current can be further tuned by simply applying a gate voltage to control the energy levels in graphene, leading to a further enhancement and fine tuning of the TER ratio. Based on these results, it is contemplated that the TER ratio can be further enhanced by employing high-K dielectrics to electrostatically control graphene. By doing so, it will enable the low-voltage, effective control of TER, which is helpful for low-power and high-performance computing and memory applications. The gate-tunable vdW FTJs with giant TER opens up new platforms for high-performance non-volatile memories.

(b) Second Example of Unexpectedly Good Results

Conventional ferroelectric tunnel junctions (FTJs) comprising metal/oxide heterostructures suffer from a relatively low tunneling electroresistance (TER; usually <$10^6$) due to the unavoidable defect states and interfacial states. Here, constructed are embodiments of van der Waals FTJs consisting of 2D ferroelectrics $CuInP_2S_6$ and 2D electronic materials (e.g., graphene and $MoS_2$) and demonstrated a record-high TER of >$10^{10}$ at room temperature. Also demonstrated is an unprecedented layer-by-layer engineering of giant TER, largely strengthening the ability to manipulate electrons' tunneling behaviors for advanced tunneling devices.

Ferroelectric tunnel junctions (FTJs) promise electrically switchable memories, sensors, and logic devices. However, traditional FTJs comprising metal/oxide heterostructures only exhibit modest tunneling electroresistance (TER). Instead, a TER of approximately $10^{10}$ is achieved due to gigantic ferroelectric modulation of band alignments of vdW stacks. In FTJ multilayered structures of the disclosure, inserting a monolayer 15 of $MoS_2$ or $WSe_2$ in between ferroelectrics 13/graphene 12 effectively enhances TER by ten times. The discovery of the giant TER in vdW FTJs opens up a new solid-state paradigm in which electrons' potential profiles can be tailored in an unprecedented layerby-layer fashion, enhancing the ability to control electrons' tunneling behaviors for emerging tunneling devices 1.

The ability to engineer potential profiles of multilayered materials is critical for designing high-performance tunneling devices such as ferroelectric tunnel junctions (FTJs). FTJs comprise asymmetric electrodes and a ferroelectric spacer, promising semiconductor platform-compatible logic and memory devices. However, traditional FTJs consist of metal/oxide/metal multilayered structures with unavoidable defects and interfacial trap states, which often cause compromised tunneling electroresistance (TER). Here, constructed are embodiments of van der Waals (vdW) FTJs by a layered ferroelectric $CuInP_2S_6$ (CIPS) 13 and graphene 12. Owing to the gigantic ferroelectric modulation of the chemical potentials in graphene by as large as ~1 eV, demonstrated is a giant TER of $10^9$. While inserting just a monolayer 15 of $MoS_2$ between CIPS 13/graphene 12, the off state is further suppressed, leading to $>10^{10}$ TER. The discovery opens a new solid-state paradigm where potential profiles can be unprecedentedly engineered in a layer-by-layer fashion, fundamentally strengthening the ability to manipulate electrons' tunneling behaviors and design advanced tunneling devices 1.

Among all the bizarre phenomena governed by quantum mechanics, the tunneling behavior is clearly beyond any classical theory's comprehension when it comes to the penetration of matter waves and the transmission of particles through a high potential barrier—that is, the classically forbidden region. Fundamentally differing from diffusive transport, electrons' quantum tunneling through the classically forbidden region leads to a wide spectrum of remarkable phenomena such as Klein tunneling and pivotal devices such as magnetic and ferroelectric tunnel junctions. Quantum tunneling efficiency sensitively depends on the details of the potential barriers including heights and widths. Given such a dependence is an exponential function, the tunneling can be turned on and off with stark contrast, thereby leading to the development of a broad range of important devices such as nonvolatile memories and steep-slope tunneling field-effect transistors.

As noted above, in some embodiments a tunneling layer 13 is implemented between a pair of asymmetric electrodes 14. The tunneling transmission can be toggled with ferroelectric polarizations because the relative potential profiles are altered by the opposite electric dipoles, leading to a tunneling resistance contrast defined as tunneling electroresistance (TER) of a ferroelectric tunnel junction (FTJ). However, in practical multilayered material systems such as metal-oxide-metal trilayer structures, defect states and interfacial trap states are inevitable, sometimes entangled with metal-induced gap states and the associated Fermi-level pinning. The defect states complicate the intermediate tunneling channels and thus tend to deteriorate the TER, and Fermi-level pinning sets roadblocks for the efficient ferroelectric alternation of the relative potential profiles, suppressing the TER.

The recently emerged two-dimensional (2D) layered van der Waals (vdW) materials, and in particular the vdW ferroelectrics (e.g., $CuInP_2S_6$ (CIPS) and $In_2Se_3$), promise a giant TER owing to the negligible defects, absence of interfacial states in vdW heterojunctions, and the easy tunability of the chemical potentials of 2D materials. The high crystallinity of 2D vdW materials retains at the atomic level and even at the wafer scale, which holds unprecedented prospects for next-generation high-performance, energy-efficient FTJs considering that the ultrathin, defect-free ferroelectrics can allow low-voltage writing operations.

Thus, some embodiments of the present disclosure may be constructed using vdW heterostructure-based FTJs 1 comprising, or primarily consisting of, 2D ferroelectric CIPS and 2D electronic materials (i.e., graphene, $MoS_2$, and $WSe_2$). Such embodiments have demonstrated a record-high TER of $>10^{10}$ at room temperature. This large TER arises from the gigantic ferroelectric modulation of the tunneling barrier height and the band positions of 2D electronic materials. Remarkably, an order-of-magnitude enhanced TER in Cr/CIPS/graphene (CrCG) tunnel junctions was achieved by simply adding a monolayer 15 ($MoS_2$ or $WSe_2$) in between CIPS 13 and graphene 12.

This addition of a monolayer 15 caused improved results, in a manner that would not have been readily determinable or expected.

The electronic bandgap of the transition metal dichalcogenides (i.e., $MoS_2$ or $WSe_2$) is very sensitive to electronic bandgap. Although having more layers will increase the resistance of the contact at the graphene side, the electronic bandgap of TMD may decrease with an additional number of layers. Important questions a design should address include what number of layers will lead to the largest asymmetry in the resistance with the two electric polarization. There should be an optimal number of layers, which has not been determined previously.

The discovery of the giant TER in vdW FTJs and the demonstration of the effectiveness of the layer-by-layer engineering of FTJs open the door to an emerging class of vdW heterostructures for studying fundamental tunneling physics and exploring tunneling devices such as nonvolatile memories, logics, and logic-in-memory technologies.

FIG. 7 illustrates example device structures and band diagrams for CrCG FTJs 1. Specifically, FIG. 7 illustrates the device structures and band diagrams for the on state and off state of a CrCG tunneling device 1. FIG. 7A is a schematic of the CrCG tunneling device 1 in on state. FIG. 7B is a schematic of the CrCG tunneling device 1 in off state. The built-in polarization fields in the CIPS 13 are indicated by the arrows. FIG. 7C is an optical image of the fabricated CIPS 13/graphene 12 heterostructure on a 260-nm-thick $SiO_2$/Si chip 11. The thin graphene and CIPS flakes are circled by dashed lines, respectively. The scale bar in FIG. 7C is 10 µm. FIG. 7D is a band diagram for the on-state FTJ. FIG. 7E is a band diagram for the off-state FTJ. The built-in polarization fields in the CIPS 13 are indicated by the arrows, and the tunneling currents are indicated by the arrows. FIG. 7F is a corresponding Raman spectra of graphene 12 and CIPS 13 of the heterostructure 1 shown in FIG. 7C, indicating the high crystalline quality of these vdW flakes. The comparable peak intensities of the 2D and G peaks in graphene suggest it is a bi-layer graphene 12. The CIPS 13 thickness is estimated to be 3.5 nm by atomic force microscopy (AFM) measurement. The thinness of the CIPS flake agrees with its shallow optical contrast and sizable on-state tunneling current.

Of FIG. 7, FIGS. 7A and B illustrate the Au/Cr/CIPS/graphene multilayer stack of FTJ with CIPS 13 polarized oppositely. Under opposite polarizations, the positions of $Cu^+$ ions differ in vertical positions: for the on state, $Cu^+$ ions are pushed by the positive electric field toward the CIPS/graphene interface, and for the off state, $Cu^+$ ions are dragged away from the CIPS/graphene interface. FIG. 7C shows a representative optical image of the core heterostructure of CIPS 13/graphene 12 fabricated by mechanical exfoliation and dry-transfer process. The thin graphene flake is covered by a CIPS flake with two regions of different thicknesses. Specifically, FIG. 7F shows the Raman spectra of the exfoliated CIPS and graphene thin flakes, measured by an excitation laser of 532 nm wavelength at room temperature. The intensities of the 2D band (2,685 cm$^{-1}$) and the G band (1,580 cm$^{-1}$) of the graphene flake are comparable, suggesting that the graphene consists of two atomic layers. As for CIPS, the vibration of anion ($P_2S_6^{4-}$) corresponds to the peak at 100 cm$^{-1}$, and the S—P—S vibration corresponds to the peak at 262 cm$^{-1}$. 26 Cu$^+$ ions and P-P stretching are responsible for the peaks located at 316 and 373 cm$^{-1}$, respectively. These well-defined Raman peaks agree with the previous work on high-quality CIPS crystals, indicating the high crystalline quality of the CIPS flake with low defect density, which is critical for achieving a very large TER. The thickness of the CIPS flake of the thinner region in FIG. 7C is ~3.5 nm, as estimated by optical contrast first and confirmed by atomic force microscopy (AFM) measurement.

The ferroelectric polarization with built-in electric field can cause the effective modulation of the energy levels in graphene and the height of the tunneling barrier. Specifically, the positive polarization (pointing through CIPS 13 toward the CIPS 13/graphene 12 interface) causes the lowering of energy levels in both CIPS 13 and graphene 12 along the CIPS-graphene direction, as illustrated in FIG. 7D. Conversely, the negative polarization gradually lifts up the energy levels of CIPS 13 and graphene 12 along the CIPS-graphene direction, as illustrated by FIG. 7E. There is a fundamental difference between the vdW heterostructure and the oxide/metal heterostructures in traditional FTJs. It has been well known that the metal/insulator heterojunctions easily produce mid-gap states due to the evanescent wavefunction of metals decaying into the insulators, which produces the gap states that potentially pin the Fermi level. The mid-gap states themselves complicate the tunneling channels that often cause the compromised TER, and Fermi-level pinning largely undermines the effectiveness of the ferroelectric modulation of the band alignments across the stacks. In stark contrast, CIPS/graphene heterojunctions are free from defects and Fermi-level pinning and can thus allow the effective ferroelectric modulation of chemical potentials in graphene by as large as ~1 eV and thus the effective ferroelectric toggling between two contrasting band alignments (FIGS. 7D and E), potentially leading to a giant TER.

FIG. 8 illustrates device structures and electrical characteristics of examples of CrCG and Cr/CIPS/MoS$_2$/graphene (CrCMG) FTJs. Specifically, FIG. 8 illustrates example device structures and current-voltage characteristics of the CrCG and CrCMG tunneling devices. FIG. 8A is a schematic of the CrCG tunneling device. The ultrathin CIPS flake serves as the tunneling layer here. FIG. 8B is an optical image of a CrCG tunneling device with a top electrode (TE) and bottom electrode (BE). Areas of graphene 12 and CIPS 13 are circled by dashed lines, respectively. The scale bar in FIG. 8B is 10 mm. FIG. 8C illustrates current-voltage characteristics of the on and off states of the CrCG tunneling device. TER is measured using −0.4 V reading voltage. FIG. 8D is a schematic of the CrCMG tunneling device. FIG. 8E is an optical image of the CrCMG tunneling device, showing three subdevices with three different TEs, TE1 (CrCMG), TE2 (CrCMG), and TE3 (CrCG), sharing the common BE. Areas of graphene 12, MoS$_2$, 15 and CIPS 13 are circled by dashed lines, respectively. The scale bar in FIG. 8E is 20 mm. FIG. 8F illustrates current-voltage characteristics of the CrCMG tunneling device with TE1. TER is measured using −0.4 V reading voltage.

Figure 8A:
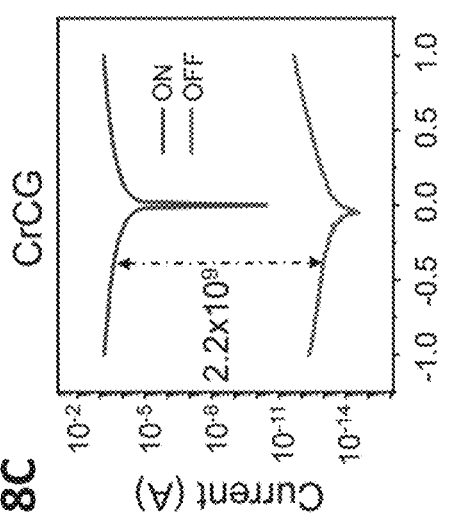
FIG. 8A illustrates a device structure according to an embodiment hereof.
Figure 8B:
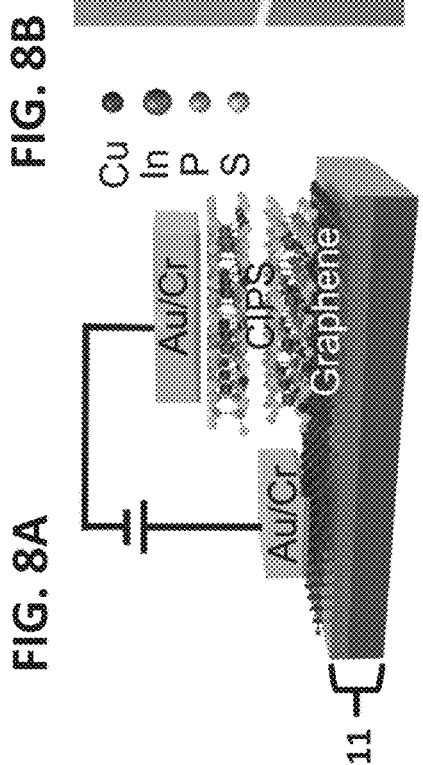
FIG. 8B is an optical image according to an embodiment hereof, such as that of FIG. 8A.
Figure 8C:
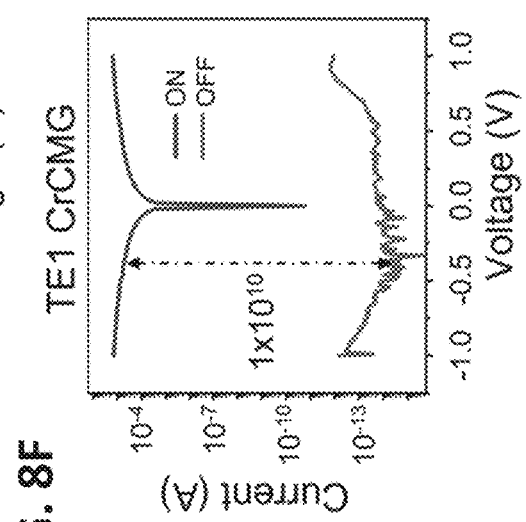
FIG. 8C is a graph of current vs. voltage for an embodiment hereof, such as that of FIG. 8A.

Fabricated and electrically characterized are CrCG tunneling devices 1. FIG. 8A is the schematic of the CrCG tunneling device structure 1, where a thin CIPS flake serves as the tunneling layer and the bottom and top electrodes are graphene and Cr, respectively. FIG. 8B shows a representative optical image of the CrCG tunneling device 1. As discussed in detail later, a pulse voltage was applied to flip the ferroelectric polarization. After the writing operation, the voltage was swept and the tunneling current was measured. Both on- and off-state current-voltage characteristics displayed in FIG. 8C have typical tunneling features with a slight asymmetry between positive and negative bias voltages, which is caused by the asymmetric device structure (i.e., top and bottom electrodes adopt different metals). Under the −0.4 V reading voltage, the on-state current and off-state current of this device are $2.5 \times 10^4$ and $1.1 \times 10^{13}$ A, respectively, leading to a gigantic on/off ratio of $2.2 \times 10^9$, which is three orders of magnitude higher than the maximum TER reported in conventional FTJs (primarily using oxide ferroelectrics). This may be a record-high TER in FTJs at room temperature reported to date.

Figure 8D:
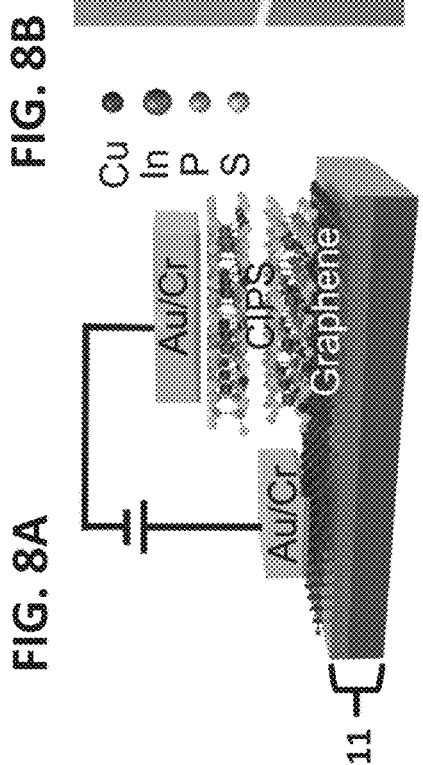
FIG. 8D illustrates a device structure according to an embodiment hereof.
Figure 8E:
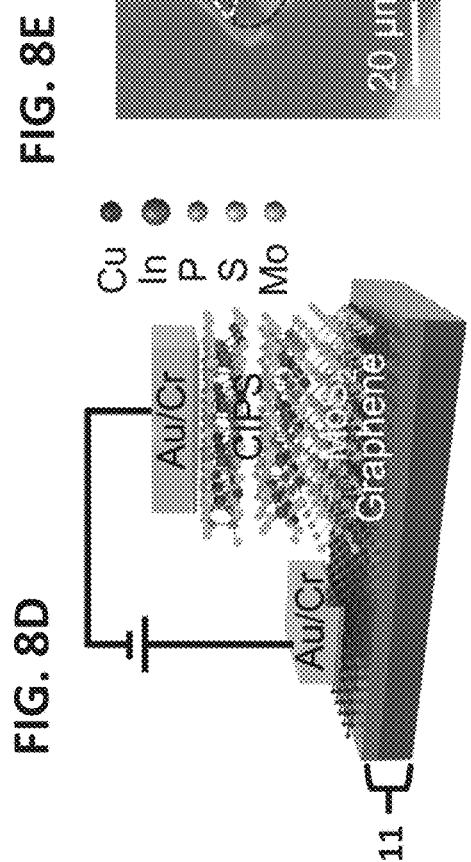
FIG. 8E is an optical image according to an embodiment hereof, such as that of FIG. 8D.
Figure 8F:
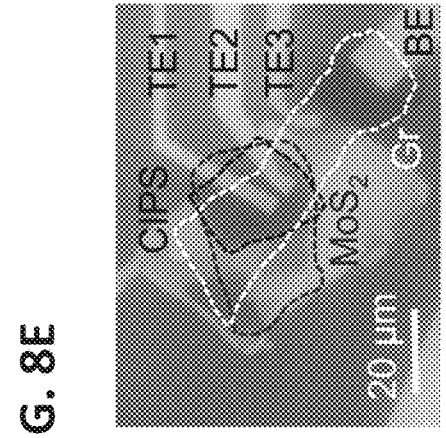
FIG. 8F is a graph of current vs. voltage for an embodiment hereof, such as that of FIG. 8D.

The vdW heterojunctions not only provide unique platforms that could enable a giant TER but also open up unprecedented opportunities to engineer band alignment in a layer-by-layer fashion. Here, monolayer transition metal dichalcogenides (TMDs) was inserted in these tunnel junctions to further tune the band alignments. FIG. 8D shows the schematic of the CrCMG tunneling device 1, and FIG. 8E shows the optical image of a fabricated CrCMG device. Remarkably, in the CrCMG device 1, an even higher TER of $5.1 \times 10^{10}$ (FIG. 8F) was observed. This device exhibits a very low off-state current of $1.1 \times 10^{14}$ A, while it can reach a $5.6 \times 10^4$ A on-state current, measured by the reading voltage of −0.4 V. Compared with the CrCG results shown in FIG. 8C, it appears that the monolayer 15 of MoS$_2$ promotes the tunneling device 1 with one-order-of-magnitude-higher TER.

FIG. 9 illustrates layer engineering of the TER in an example CrCG tunneling device by inserting a monolayer 15 of MoS$_2$ in between CIPS 13/graphene 12. FIG. 9A is a schematic of the device structure. Au/Cr1 and Au/Cr2 refer to TE1 (CrCG) and TE2 (CrCMG) in the optical image in FIG. 9B. FIG. 9B is an optical image of the CrCG and CrCMG tunnel junctions. There is a monolayer MoS$_2$ flake under the TEs labeled with TE2 and TE3, while the graphene directly contacts the top CIPS 13 under the TEs labeled with TE1 and TE4. Graphene 12, MoS$_2$, 15 and CIPS 13 are circled by dashed lines, respectively. Scale bar, 10 mm. FIG. 9C is a Raman spectrum of the MoS$_2$ in the device shown in FIG. 9B. The distance between two peaks is ~19 cm$^{-1}$, demonstrating that the MoS$_2$ flake is a monolayer. FIG. 9D shows current-voltage characteristics of the CrCG and CrCMG tunnel junctions. The largest difference between the two off-state currents is around 10 times. FIG. 9E shows a band diagram for the CrCMG tunnel junction in on state. FIG. 9F is a band diagram of the CrCMG tunnel junction in off state. In FIG. 9E-F, the built-in polarization fields in the CIPS 13 are indicated by the arrows shown, and likewise the tunneling currents are also indicated by the arrows shown.

FIG. 9 illustrates layer engineering of the TER in vdW FTJs. The giant TER of >$10^{10}$ achieved in CrCMG tunnel junctions is remarkable not only because of the giant TER itself but also because it indicates a promising prospect of layer-by-layer engineering of the band alignments and thus the resultant fine design and engineering of TER. To confirm that the experimentally observed one-order-of magnitude enhancement in the CrCMG device with respect to the CrCG device is not because of sample variance but indeed is caused by the presence of the monolayer 15 of MoS$_2$, experiments were designed and controlled based on two directly comparative devices, between which the only difference is the monolayer $MoS_2$. As shown in FIG. 9A, the CrCG and CrCMG devices share the same graphene flake and the same uniform CIPS flake. By doing so, the thickness of graphene (and also CIPS) in these two types of devices is identical. FIG. 9B presents the optical image of the fabricated devices. There are four devices on this chip, sharing the same bottom electrode labeled as BE, and there is a monolayer $MoS_2$ flake under the top electrodes 14 labeled with top electrode 2 (TE2) and TE3 while the graphene 12 directly contacts the top CIPS 13 under the TEs labeled with TE1 and TE4. As shown in FIG. 9C, the Raman E2g and A1g peaks of $MoS_2$ are located at 385 and 404 $cm^{-1}$, respectively, with the peak frequency separation 19 $cm^{-1}$, confirming it is a monolayer 15 of $MoS_2$.

Figure 9A:
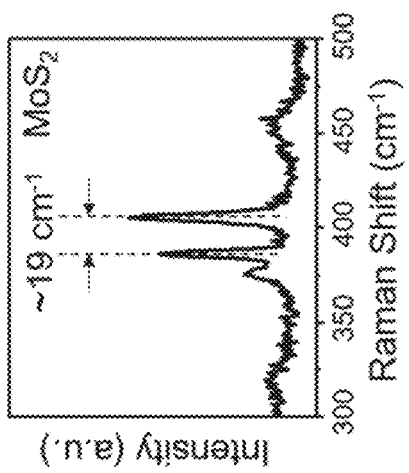
FIG. 9A is a schematic of a device structure according to an embodiment disclosed herein.
Figure 9B:
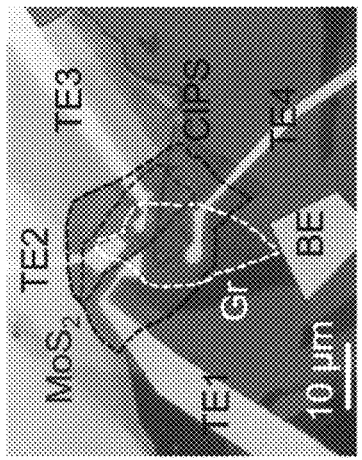
FIG. 9B is an optical image of CrCG and CrCMG tunnel junctions for the embodiment of FIG. 9A.
Figure 9C:
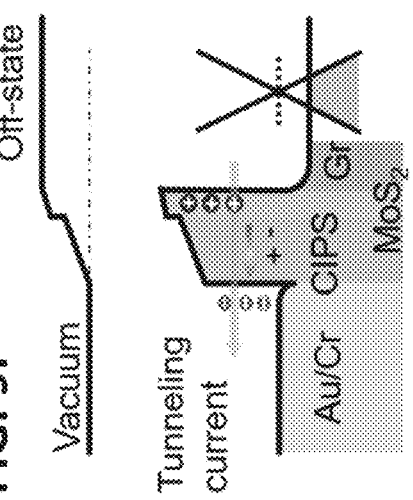
FIG. 9C is a Raman spectrum graph relating to the device shown in FIG. 9A.
Figure 9D:
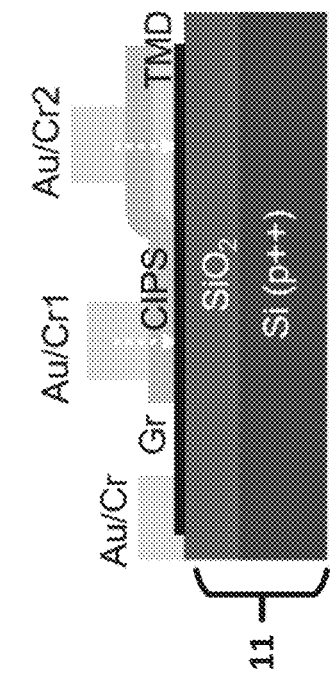
FIG. 9D is a graph showing current-voltage characteristics relating to the device of FIG. 9A.
Figure 9E:
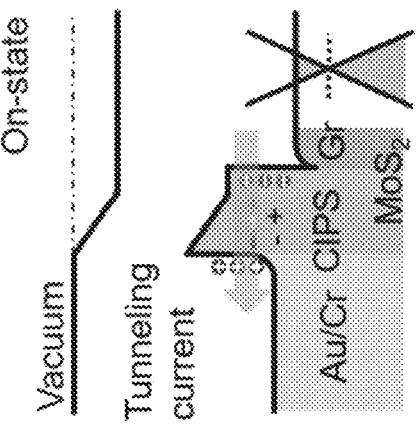
FIG. 9E shows a band diagram for tunnel junctions in an on state.
Figure 9F:
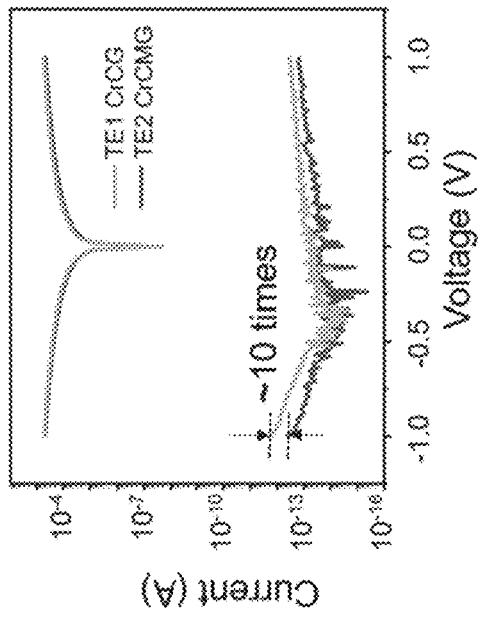
FIG. 9F is a band diagram for a tunnel junction in off state.

FIG. 9D shows the current-voltage characteristics of the CrCG and CrCMG tunnel junctions. The on-state currents of these two devices are similar, while the CrCMG tunnel junction exhibits a one-order-of-magnitude-lower off-state current than the CrCG tunnel junction, which causes a higher TER in the CrCMG tunnel junction. Band diagrams of the on and off states of the CrCMG tunnel junction are shown schematically in FIGS. 9E and F, based on the calculated band alignment of CIPS/$MoS_2$ by DFT. As shown in FIG. 9E, for the on state, the conduction band minimum (CBM) of $MoS_2$ is close to the CBM of CIPS 13. The positive polarization in the on state tends to n-type dope $MoS_2$. Given that freshly exfoliated $MoS_2$ typically exhibits n-type behavior, the positive polarization will keep $MoS_2$ n-type doped. Therefore, in this on state, the monolayer 15 of $MoS_2$ serves as a thin conductive material in this structure and will not have obvious effects on the on-state tunneling currents. In stark contrast, for the off state, the CBM of $MoS_2$ is lifted higher than the CBM of CIPS 12. In other words, the negative polarization tends to deplete the originally n-type doped $MoS_2$, making it more intrinsic (i.e., more insulating). In this scenario, the $MoS_2$ serves as an insulating layer to effectively increase the width of the barrier. The band diagram in FIG. 9F implies that the presence of $MoS_2$ with higher CBM than the CBM of CIPS 15 increases the tunneling barrier height as well. Thus, in the off state, the monolayer 15 of $MoS_2$ will effectively block the electron tunneling, leading to the further suppressed off-state current.

The effective suppression of the off-state current by one order of magnitude through adding a monolayer 15 of $MoS_2$ highlights the effective strategy of layer-by-layer engineering of the potential profiles in the tunneling pathway. As an important control experiment, it was decided to insert a monolayer 15 of $WSe_2$ in the CrCG device 1. The reason for choosing $WSe_2$ is because of its contrasting property from $MoS_2$: the as-exfoliated $MoS_2$ is typically n-type doped, while the as-exfoliated $WSe_2$ is typically p-type doped. The p-type doped $WSe_2$ has a large work function, and its valence band can directly serve to receive the electrons that tunnel through CIPS 12. In other words, $WSe_2$ in the p-type doping region can serve as the conductive electrode to receive the tunneling electrons. Note that the relatively flat band of the covalently bonded semiconductor $WSe_2$ has a much larger density of states than graphene, thereby potentially allowing a higher tunneling transmission than graphene.

Figure 10A:
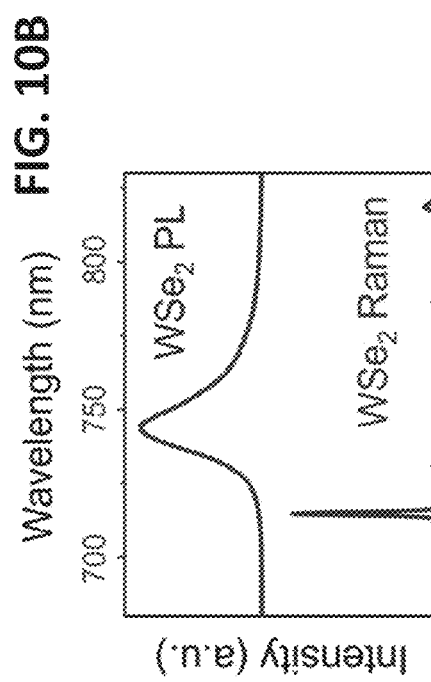
FIG. 10A is an optical image of an example CrCWG tunneling device.
Figure 10B:
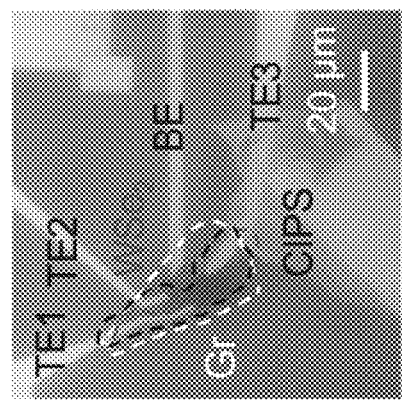
FIG. 10B is a graph showing Raman and photoluminescence (PL) spectra relating to the device of FIG. 10A.

To confirm this scenario, the devices were fabricated in a directly comparative manner. FIG. 10A shows the optical image of the Cr 14b/CIPS 13/$WSe_2$/graphene 12 (CrCWG) tunneling device 1, in which the regions surrounded by the dashed lines represent the monolayer 15 of $WSe_2$ and the few-layer graphene underneath, respectively. Device 1 under TE1 is the CrCWG structure 1, while device 2 under TE2 is the CrCG structure 1. Again, between these two devices, the only difference is the presence and the absence of the monolayer $WSe_2$. FIG. 10B shows the well-defined Raman peaks of $WSe_2$ (e.g., the E2g mode of $WSe_2$ at 244 $cm^{-1}$), and the strong photoluminescence peak at the energy 1.66 eV demonstrates the monolayer nature of the $WSe_2$ flake.

Figure 10C:
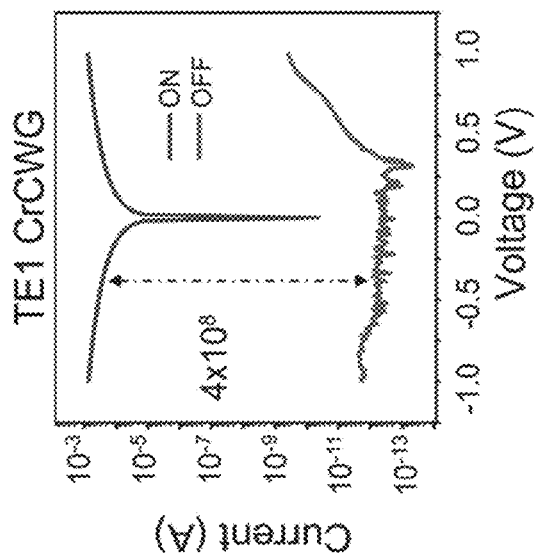
FIG. 10C is a graph showing current-voltage characteristics of the CrCG tunneling device of FIG. 10A.
Figure 10D:
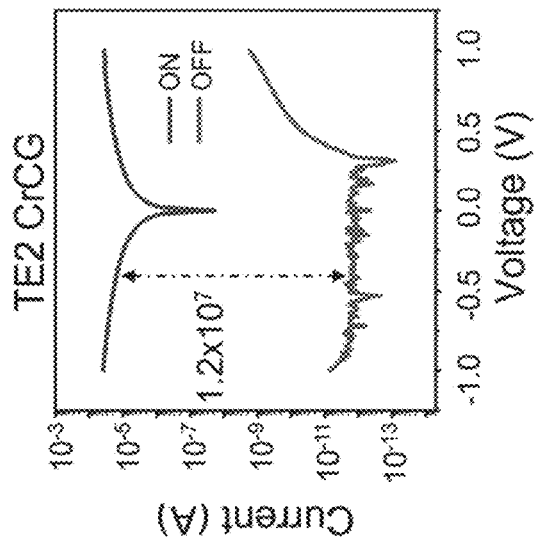
FIG. 10D shows current-voltage characteristics of the CrCWG tunneling device of FIG. 10A.

Indeed, experimentally observed was the one-order-of-magnitude-enhanced TER with the one-order-of-magnitude-enhanced on-state current in the CrCWG device 1 with respect to the CrCG device 1. FIG. 10C shows the current-voltage characteristics of the CrCG tunneling structure with TE2, exhibiting a low off-state current of $1.2 \times 10^{12}$ A and a high on-state current of $1.5 \times 10^5$ A with a reading voltage of −0.4 V, leading to the TER of $1.2 \times 10^7$. In the device with TE1, which has an additional $WSe_2$ layer 15 in the structure 1, using the same reading voltage with the TE1 device, the off-state current can be as low as $6.7 \times 10^{13}$ A, and the on-state current can reach $2.8 \times 10^4$ A, an order of magnitude higher than the on-state current of the CrCG device 1 (FIG. 10D). Thus, a higher TER of $4.2 \times 10^8$ is achieved with respect to the TER of $1.2 \times 10^7$ in the CrCG device 1. These results clearly show that the insertion of monolayer TMDs 15 can enhance the TER effectively. Interestingly, as discussed, the inserted $MoS_2$ enhances the TER primarily by suppressing the off-state current, while the inserted $WSe_2$ enhances the TER primarily by enhancing the on-state current. Such layer-by-layer engineering of the potential profiles opens up the new avenues to study the fundamental tunneling physics and explore novel tunneling devices for memories and logic applications.

Thus, FIG. 10 illustrates layer engineering of the TER in CrCG tunneling device by inserting a monolayer 15 of $WSe_2$ in between CIPS 13/graphene 12. FIG. 10A is an optical image of the CrCWG tunneling device 1. There is a monolayer $WSe_2$ flake under the TEs labeled with TE1 and TE3, while the graphene 12 directly contacts the top CIPS 13 under the TE labeled with TE2. Graphene 12, $WSe_2$, and CIPS 13 are circled by dashed lines, respectively. Scale bar, 20 mm. FIG. 10B is a graph showing Raman and photoluminescence (PL) spectra of the monolayer 15 of $WSe_2$. FIG. 10C is a current-voltage characteristics of the CrCG tunneling device with TE2, showing an on/off ratio of $1.2 \times 10^7$ at −0.4 V reading voltage. FIG. 10D shows current-voltage characteristics of the CrCWG tunneling device with TE1, showing an on/off ratio of $4.2 \times 10^8$ at −0.4 V reading voltage.

FIG. 11 illustrates asymmetric gate tunability in CrCG tunneling junction. FIG. 11A is a schematic of the gate-tunable FTJ structure 1. The 260-nm-thick $SiO_2$ 11b serves as the dielectric layer, and the bottom Si (p++) 11a serves as the back-gate electrode 11a. FIGS. 11B-C are on-state current-voltage characteristics for FTJs under different negative (FIG. 11B) and positive (FIG. 11C) gate voltages. The difference in the on-state currents is highlighted in the inset. The on-state current increased more obviously with the varying negative gate voltages than with the varying positive gate voltages. FIG. 11D is a graph showing on-state currents (with 1 V reading voltage) under different gate voltages. This asymmetric gate-tunable on-state current under positive and negative gate voltages arises from the initial n-type doping of graphene. As illustrated by the inset, when graphene is initially n-type doped, the negative voltages will move the Dirac point close to the Fermi level, but the positive voltages will move the Dirac point away from the Fermi level. The energy levels are easier to be modulated when the Dirac point is moved close to the Fermi level with respect to the scenario when the Dirac point is moved away from the Fermi level.

Figure 11A:
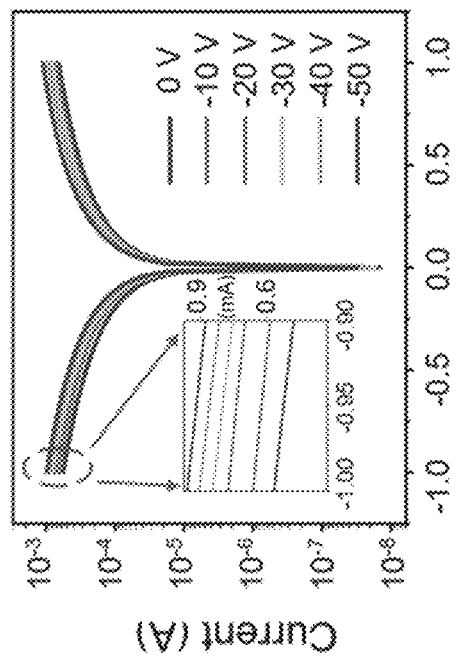
FIG. 11A is an optical image of a CrCWG tunneling device in accordance with an embodiment hereof.

FIG. 11 illustrates layer engineering of the TER in CrCG tunneling device by inserting a monolayer 15 of WSe$_2$ in between CIPS 13/graphene 12, FIG. 11A is an optical image of the CrCWG tunneling device 1. There is a monolayer WSe$_2$ flake under the TEs labeled with TE1 and TE3, while the graphene directly contacts the top CIPS 13 under the TE labeled with TE2. Graphene 12, WSe$_2$, 15 and CIPS 13 are circled by dashed lines, respectively. Scale bar, 20 mm. FIG. 11B is graph of Raman and photoluminescence (PL) spectra of the monolayer 15 of WSe$_2$. FIG. 11C shows current-voltage characteristics of the CrCG tunneling device 1 with TE2, showing an on/off ratio of $1.2 \times 10^7$ at $-0.4$ V reading voltage. FIG. 11D is a graph showing current-voltage characteristics of the CrCWG tunneling device 1 with TE1, showing an on/off ratio of $4.2 \times 10^8$ at $-V$ reading voltage.

Figure 11B:
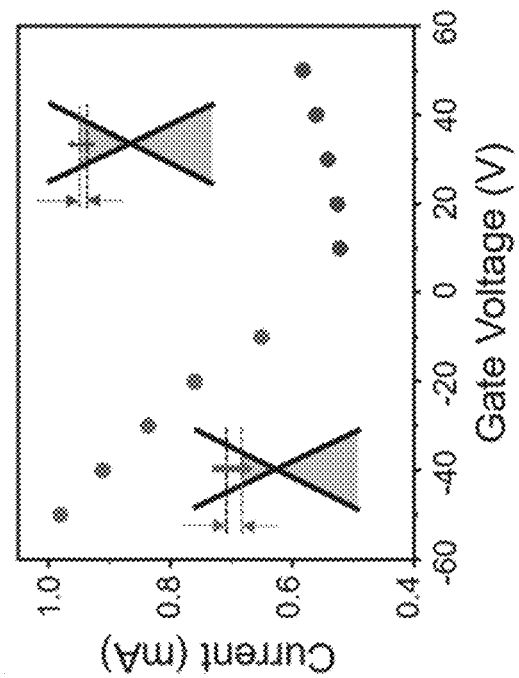
FIG. 11B is graph of Raman and photoluminescence (PL) spectra.
Figure 11C:
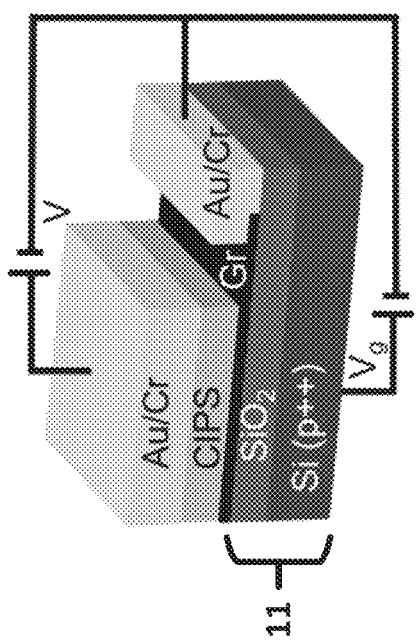
FIG. 11C is a graph showing current-voltage characteristics of the CrCG tunneling device of FIG. 11A.
Figure 11D:
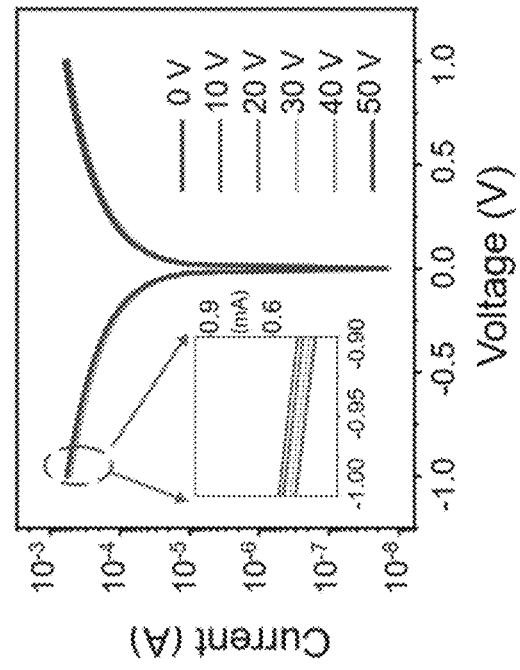
FIG. 11D is a graph showing current-voltage characteristics of the CrCWG tunneling device of FIG. 11A.

Given the remarkable tunability of 2D materials in general, the Si substrate 11 and SiO$_2$ dielectric are further utilized to supply a back gate to tune the TER of the CrCG FTJs with the device structure 1 shown in FIG. 11A. FIGS. 11B-C show the on-state current-voltage characteristics of the FTJ devices 1 with different positive gate voltages (FIG. 11B) and negative gate voltages (FIG. 11C), respectively. The FIG. 11B-C show that the on-state current increased more obviously under negative gate voltages with respect to those under positive gate voltages. FIG. 11D summarizes the on-state current values under different gate voltages with a reading voltage of 1 V, confirming that the on-state current changes faster with the varying negative gate voltages than with varying positive gate voltages.

The asymmetric gate tunability of on-state currents is related to the initial doping scenario of the graphene. Specifically, when a FTJ is in on state, the Fermi level of the graphene is above the Dirac point (FIG. 11D). Applying the gate voltages of the same amplitude but of opposite signs will cause the same amount of charge increase or decrease. When applying a negative voltage, Fermi level will move downward at a faster pace with respect to moving upward under a positive voltage. This is simply because the density of states near the Dirac point is lower but the density of states away from the Dirac point is higher.

In summary, vdW heterostructures were constructed based FTJs consisting of 2D ferroelectrics CIPS and 2D electronic materials (i.e., graphene and TMDs) and demonstrated a giant TER of $>10^{10}$ at room temperature. The record-high TER arises from the giant ferroelectric modulation of the band alignments through the vdW stacks. The insertion of both monolayer 15 of MoS$_2$ and monolayer 15 of WSe$_2$ can effectively enhance the TER of CrCG tunnel junction by an order of magnitude yet with different underlying band realignment behaviors. Furthermore, the 2D vdW FTJs 1 allow the fine gate tunability of the on-state tunneling current, which endows vdW FTJs 1 with extra electrical controllability for enhanced functions. The discovery of the giant TER in vdW FTJs 1 and the demonstration of the effectiveness of the layer-by-layer engineering of FTJs 1 open the door to the emerging class of vdW heterostructures 1 for studying the fundamental tunneling physics and exploring tunneling devices such as nonvolatile memories, logics, and logic-in-memory devices.

Experimental Procedures

A CIPS via a flux-based method was grown. First, synthesized was P$_2$S$^5$ via reaction of the elements P (Alfa Aesar, Puratronic, 99.999%) and S (Alfa Aesar, Puratronic, 99.999%) in a stoichiometric ratio at 300° C. in a sealed, thick-walled quartz ampoule. The metal elements Cu (Alfa Aesar, powder, 100 mesh, 99.999%, reduced in H2 gas at 300° C. prior to reaction) and In (Alfa Aesar, ingot, 99.999%) were mixed with the flux in a molar ratio Cu:In:P$_2$S$_5$ of 1:1:3 and placed in a 5-mL Canfield crucible set (LSP Industrial Ceramics). The crucible set, including frit and catch crucible, was sealed in quartz under partial Ar atmosphere. The sealed ampoule was then placed in a muffle furnace, heated to 650° C. at 30° C./h, held at that temperature for 36 h, and then cooled to 250° C. at 6° C./h. At 250° C., the sample was removed from the furnace and centrifuged to decant the P2S5 flux, leaving crystals behind of a maximum size of 8×8 mm. Energy-dispersive X-ray spectroscopy (EDS) analysis was performed and compositions of CIPS, within error were found. CIPS synthesized via a chemical vapor transport method was used in some testing experiments.

Device Fabrication

For the Cr 14b/CIPS 13/TMD 15/graphene 12 FTJs 1, a thin-layer graphene 12 was first mechanically exfoliated on a 260-nm-thick SiO$_2$/Si substrate 11. Then, monolayer TMD 15 and thin CIPS film 13 were exfoliated on polydimethyl-siloxane (PDMS) and transferred onto the graphene flake in sequence, using the all-dry viscoelastic stamping procedure through a transfer stage under the optical microscope. The polymethyl methacrylate (PMMA) was spin coated on the graphene 12/CIPS 13 or graphene 12/TMD 15/CIPS 13 heterostructure as photoresist and annealed in air at 120° C. for 2 min. Finally, electron-beam lithography was used to lay out the TE, and the bi-layer metallic electrodes (Cr/Au, 5/50 nm) were deposited by thermal evaporation.

Electrical Characterization

A pulse writing voltage with a period of 200 ms was used to flip the ferroelectric polarization of the tunneling devices by Keithley 4200A-SCS semiconductor parameter analyzer. Depending on the specific measurement modes, a series of sweeping voltages were applied to collect the current-voltage data or a single reading voltage (e.g., −0.4 V) was applied to record the tunneling current. To avoid the ferroelectric-paraelectric phase transition undesirably caused by the Joule heating effect arising from the tunneling current, a low duty cycle (0.5%) was used to keep the device temperature lower than the ferroelectric Curie temperature (Tc) of CIPS (315 K). The pulse writing voltage was tested from a relatively low amplitude (2 V) with an increasing step of 0.2 V to avoid unwanted device damage.

Raman Spectroscopy

The measurement was based on an Andor spectrometer with a Newton 970 series camera at room temperature. The 532-nm laser was focused on the samples via a 503 objective lens with a numerical aperture of 0.5. A one band-pass filter was used to clean up the laser spectral noise and three Bragg notch filters to suppress the Rayleigh line bandwidth down to 8 cm$^{-1}$. A 1,200 grooves mm$^{-1}$ grating was used to achieve a spectral resolution of 0.79 cm$^{-1}$ per pixel. The integration time was 15 s for each spectrum acquisition.

DFT Calculations

The ab initio calculations were performed by DFT using the Vienna Ab initio Simulation Package (VASP) code. The exchange and correlation functionals were implemented by the generalized gradient approximation (GGA) of the Perdew-Burke-Ernzerhof (PBE) functional. The monolayer-MoS$_2$/bi-layer-CIPS heterostructure was constructed with a vacuum layer larger than 15 A°, in order to avoid interactions between adjacent super cells. The lattice constants for pristine MoS$_2$ and CIPS were 3.16 and 6.05 A°, respectively. Here, the lattice constant of CIPS was fixed and deposited the 2×2 MoS$_2$ supercell on the bi-layer CIPS unit cell. The lattice mismatch was 4.3%. All structures were fully relaxed until the force converged on each atom less than 102 eV/A°, and the energy criterion was set to 106 eV. The plane-wave cutoff energy was set to 420 eV. Brillouin zone was sampled using G-centered 14×14×1 Monkhorst-pack k mesh. The vdW interaction was corrected by the DFT-D3 Grimme method.

Figure 12:
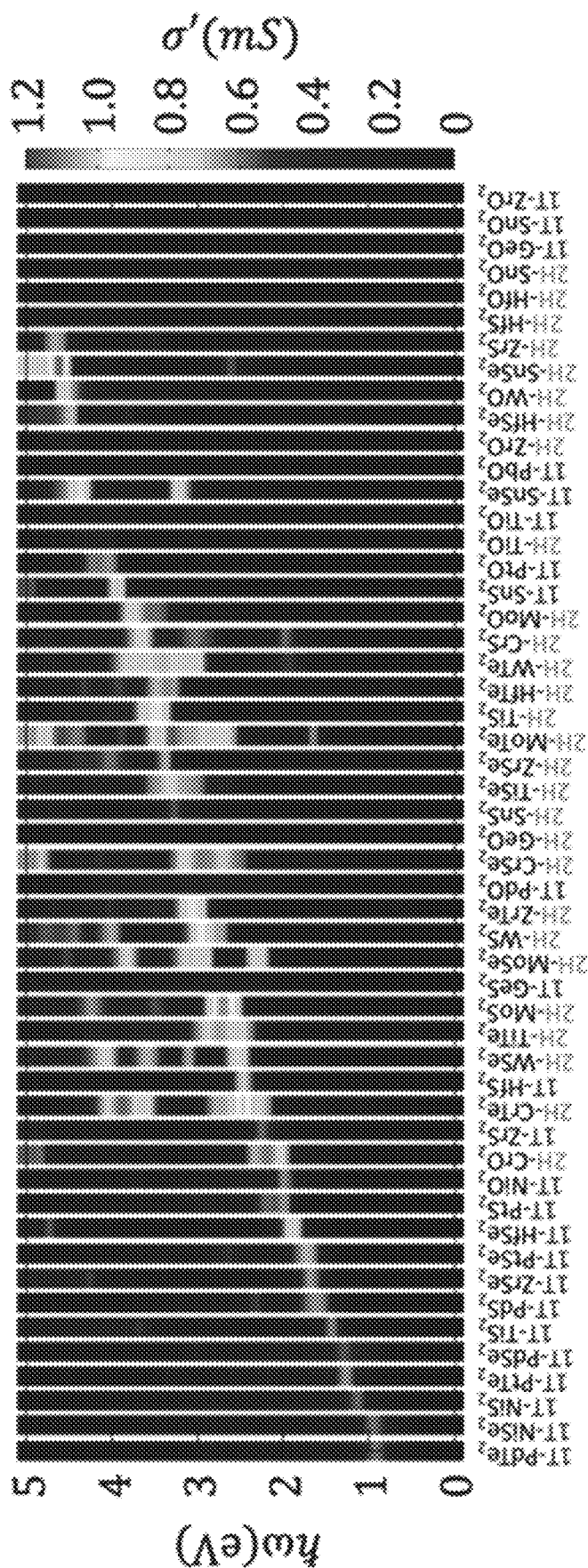
FIG. 12 is a chart showing transition metal dichalcogenides that are semiconducting.

It should be understood, however, that other materials may be utilized in such a layering architecture. In principle, any material in the transition metal dichalcogenides family which is semiconducting is feasible. For example, FIG. 12 is a chart showing transition metal dichalcogenides that are semiconducting.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as, e.g., "either," "only one of," or "exactly one of." Further, a list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of each of A, B, and C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C. In general, the term "or" as used herein only indicates exclusive alternatives (e.g., "one or the other but not both") when preceded by terms of exclusivity, such as, e.g., "either," "only one of," or "exactly one of."

Although the present technology has been described by referring to certain examples, workers skilled in the art will recognize that changes can be made in form and detail without departing from the scope of the discussion.

What is claimed is:

1. A ferroelectric device comprising:
   a substrate;
   a first two-dimensional (2D) ferroelectric layer disposed on the substrate, the first 2D ferroelectric layer comprising a first 2D ferroelectric material and being 2 to 4 monolayers in thickness;
   a second 2D ferroelectric layer selectively disposed over a portion of the first 2D ferroelectric layer, the second 2D ferroelectric layer comprising a second 2D ferroelectric material and being at least two monolayers in thickness; and
   a first metallic electrical contact layer disposed on the first 2D ferroelectric layer and a second metallic electrical contact layer disposed on the second 2D ferroelectric layer such that the second 2D ferroelectric layer is between the second metallic electrical contact layer and the first 2D ferroelectric layer.

2. The ferroelectric device according to claim 1, wherein the first 2D ferroelectric material is graphene.

3. The ferroelectric device according to claim 2, wherein the second 2D ferroelectric layer comprises a tunneling layer.

4. The ferroelectric device according to claim 3, wherein the second metallic electrical contact layer comprises a lower metal layer and an upper metal layer, the upper metal layer being thicker than the lower metal layer.

5. The ferroelectric device according to claim 4, wherein materials the upper metal layer and lower metal layer are different materials, and a portion of the lower metal layer is in direct contact with the tunneling layer.

6. The ferroelectric device according to claim 2, wherein the first 2D ferroelectric layer is a graphene layer having a thickness of a single carbon atom.

7. The ferroelectric device according to claim 2, wherein a tunneling electroresistance (TER) of the ferroelectric device is at least $10^{10}$.

8. The ferroelectric device according to claim 1, further comprising:
   a monolayer between the first 2D ferroelectric layer and the second 2D ferroelectric layer.

9. The ferroelectric device according to claim 8, wherein the second 2D ferroelectric layer is between a metal layer and the monolayer.

10. The ferroelectric device according to claim 8, wherein the monolayer is in direct contact with the first 2D ferroelectric layer and the second 2D ferroelectric layer.

11. The ferroelectric device according to claim 8, wherein a material of the monolayer is a transition metal dichalcogenide.

12. The ferroelectric device according to claim 8, wherein a material of the monolayer is molybdenum disulfide (MoS$_2$).

13. The ferroelectric device according to claim 8, wherein a material of the monolayer is tungsten diselenide (WSe$_2$).

14. The ferroelectric device according to claim 1, wherein the second 2D ferroelectric material has a perovskite structure.

15. The ferroelectric device according to claim 1, wherein the second 2D ferroelectric material is CuInP$_2$S$_6$ (CIPS).

16. The ferroelectric device according to claim 1, wherein the second 2D ferroelectric material is SnSe.

17. The ferroelectric device according to claim 1, wherein the substrate has a thickness of approximately 260 nm.

18. The ferroelectric device according to claim 1, wherein the substrate comprises a semiconductor layer and a dielectric layer, wherein the dielectric layer is between the first 2D ferroelectric layer and the semiconductor layer.

19. The ferroelectric device according to claim 18, wherein the semiconductor layer is doped with a dopant.

20. The ferroelectric device according to claim 19, wherein the dopant is a P-type dopant.

21. A device comprising:
    a substrate;
    a first two-dimensional (2D) ferroelectric layer disposed on the substrate, the first 2D ferroelectric layer comprising a first 2D ferroelectric material;
    a second 2D ferroelectric layer selectively disposed over a portion of the first 2D ferroelectric layer, the second 2D ferroelectric layer comprising a second 2D ferroelectric material;
    a third 2D layer disposed between the first 2D ferroelectric layer and the second 2D ferroelectric layer, the third 2D layer comprising a monolayer; and a first electrical contact layer disposed on the first 2D ferroelectric layer and a second electrical contact layer disposed on the second 2D layer such that the second 2D ferroelectric layer is between the second electrical contact layer and the first 2D ferroelectric layer.

\* \* \* \* \*